(12) United States Patent
Kobayashi et al.

(10) Patent No.: US 8,482,117 B2
(45) Date of Patent: Jul. 9, 2013

(54) SEMICONDUCTOR DEVICE WITH ELECTRONIC COMPONENT INCORPORATION SUBSTRATE

(75) Inventors: Kazutaka Kobayashi, Nagano (JP); Tadashi Arai, Nagano (JP); Toshio Kobayashi, Nagano (JP)

(73) Assignee: Shinko Electric Industries Co., Ltd., Nagano-ken (JP)

( * ) Notice: Subject to any disclaimer, the term of this patent is extended or adjusted under 35 U.S.C. 154(b) by 7 days.

(21) Appl. No.: 13/181,884

(22) Filed: Jul. 13, 2011

(65) Prior Publication Data

US 2012/0013021 A1    Jan. 19, 2012

(30) Foreign Application Priority Data

Jul. 15, 2010 (JP) .................................. 2010-160869
Jun. 22, 2011 (JP) .................................. 2011-138553

(51) Int. Cl.
*H01L 23/04* (2006.01)
*H01L 23/28* (2006.01)

(52) U.S. Cl.
USPC ........... 257/698; 257/758; 257/774; 257/775; 257/788; 257/791; 257/E23.011; 257/E23.119

(58) Field of Classification Search
USPC ............... 257/698, 700, 758, 760, 773, 774, 257/775, 776, 788, 791, E23.011, E23.119
See application file for complete search history.

(56) References Cited

U.S. PATENT DOCUMENTS

| | | | |
|---|---|---|---|
| 2010/0072598 A1* | 3/2010 | Oh et al. | 257/686 |
| 2010/0072600 A1* | 3/2010 | Gerber | 257/686 |
| 2010/0148354 A1* | 6/2010 | Choi et al. | 257/698 |
| 2010/0213605 A1* | 8/2010 | Shimizu | 257/700 |
| 2010/0230823 A1* | 9/2010 | Ihara | 257/773 |
| 2010/0295170 A1* | 11/2010 | Komura et al. | 257/700 |
| 2010/0308451 A1* | 12/2010 | Kodani | 257/690 |
| 2011/0024887 A1* | 2/2011 | Chi et al. | 257/684 |
| 2011/0024888 A1* | 2/2011 | Pagaila et al. | 257/686 |
| 2011/0031598 A1* | 2/2011 | Lee et al. | 257/686 |
| 2011/0108993 A1* | 5/2011 | Kang et al. | 257/773 |
| 2011/0193235 A1* | 8/2011 | Hu et al. | 257/773 |
| 2011/0215478 A1* | 9/2011 | Yamamichi et al. | 257/773 |
| 2011/0221054 A1* | 9/2011 | Lin et al. | 257/692 |
| 2011/0260334 A1* | 10/2011 | Hasegawa | 257/774 |
| 2011/0291288 A1* | 12/2011 | Wu et al. | 257/774 |
| 2011/0309523 A1* | 12/2011 | Takahashi | 257/774 |
| 2011/0316146 A1* | 12/2011 | Pagaila et al. | 257/737 |
| 2011/0316171 A1* | 12/2011 | Shim et al. | 257/774 |

(Continued)

FOREIGN PATENT DOCUMENTS

| | | |
|---|---|---|
| JP | 2003-309243 | 10/2003 |
| WO | WO 02/15266 A2 | 2/2002 |

*Primary Examiner* — Ngan Ngo
(74) *Attorney, Agent, or Firm* — Wolf, Greenfield & Sacks, P.C.; Randy J. Pritzker

(57) ABSTRACT

An electronic component incorporation substrate and a method for manufacturing the same that provide a high degree of freedom for selecting materials. An electronic component incorporation substrate includes a first structure, which has a substrate and an electronic component. The substrate includes a substrate body having first and second surfaces. A first wiring pattern is formed on the first surface and electrically connected to a second wiring pattern formed on the second surface through a through via. The electronic component is electrically connected to the first wiring pattern. The electronic component incorporation substrate includes a sealing resin, which seals the first structure, and a third wiring pattern, which is connected to the second wiring pattern through a second via.

3 Claims, 15 Drawing Sheets

U.S. PATENT DOCUMENTS

| | | | |
|---|---|---|---|
| 2012/0018882 A1* | 1/2012 | Shim et al. | 257/737 |
| 2012/0061821 A1* | 3/2012 | Black et al. | 257/737 |
| 2012/0104562 A1* | 5/2012 | Pagaila et al. | 257/621 |
| 2012/0175779 A1* | 7/2012 | Lin | 257/773 |
| 2012/0217647 A9* | 8/2012 | Shim et al. | 257/774 |
| 2012/0223426 A9* | 9/2012 | Shim et al. | 257/737 |
| 2012/0286404 A1* | 11/2012 | Pagaila | 257/659 |
| 2012/0292785 A1* | 11/2012 | Pagaila et al. | 257/774 |
| 2012/0299174 A1* | 11/2012 | Choi et al. | 257/692 |
| 2012/0306097 A1* | 12/2012 | Kim et al. | 257/774 |

* cited by examiner

SEMICONDUCTOR DEVICE WITH ELECTRONIC COMPONENT INCORPORATION SUBSTRATE

CROSS-REFERENCE TO RELATED APPLICATIONS

This application is based upon and claims the benefit of priority from prior Japanese Patent Application No. 2010-160869, filed on Jul. 15, 2010, and prior Japanese Patent Application No. 2011-138553, filed on Jun. 22, 2011, the entire contents of which are incorporated herein by reference.

BACKGROUND OF THE INVENTION

The present invention relates to a semiconductor device and a method for manufacturing a semiconductor device.

An electronic component incorporation substrate incorporating an electronic component such as a semiconductor chip is known in the prior art (refer to, for example, International Publication No. 2002/015266 and Japanese Laid-Open Patent Publication No. 2003-309243). In a known method for manufacturing a electronic component incorporation substrate, for example, an electronic component fixed on an adhesive sheet is sealed with a sealing resin. Then, the adhesive sheet is removed, insulation layers are formed on upper and lower surfaces of the sealing resin, a hole is formed in the insulation layers to expose a connection terminal of the electronic component, and a wiring pattern (additional wiring) is formed on the connection terminal.

SUMMARY OF THE INVENTION

However, in the electronic component incorporation substrate, the material for the connection terminal of the electronic component, which is fixed on the adhesive sheet, is restricted. For example, when the connection terminal is coated with solder, the solder may cause contamination or the like when performing a wet process to form the additional wiring. Thus, an electronic component including a solder-coated connection terminal cannot be used in the above-described electronic component incorporation substrate.

When incorporating a semiconductor chip in the electronic component incorporation substrate as an electronic component, the connection terminal of the semiconductor chip has a surface of aluminum or aluminum alloy. Thus, laser processing cannot be performed to form a hole that exposes the connection terminal. The use of a $CO_2$ laser or the like to form a hole results in etching of the connection terminal of the semiconductor chip. This may damage the circuit element of the semiconductor chip. Thus, in this case, only a photosensitive material can be used as an additional wiring insulation layer that covers the sealing resin. In this manner, the material of the additional wiring insulation layer is restricted.

One aspect of the present invention is a semiconductor device provided with a first structure including a first substrate and an electronic component. The first substrate includes a first surface and an opposite second surface. The electronic component is arranged on the first surface of the first substrate and electrically connected to the first substrate. A first sealing resin layer seals the first structure and is formed on the first surface of the first substrate. An insulation layer is formed on the second surface of the first substrate. A via extends through the insulation layer. Additional wiring is formed on the insulation layer and electrically connected to the electronic component through the first substrate and the via.

A further aspect of the present invention is a method for manufacturing a semiconductor device. The method includes providing a first structure including a first substrate and an electronic component. The first substrate includes a first surface and an opposite second surface, and the electronic component is arranged on the first surface of the first substrate. The method further includes forming a first sealing resin layer that seals the first structure on the first surface of the first substrate, forming an insulation layer on the second surface of the first substrate, forming a via that extends through the insulation layer on the insulation layer, and forming additional wiring on the insulation layer to electrically connect the additional wiring to the electronic component through the first substrate and the via.

Other aspects and advantages of the present invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which.

DETAILED DESCRIPTION OF THE PREFERRED EMBODIMENTS

Each embodiment will be described hereafter with reference to the drawings. The drawings schematically show elements and differ from the actual scale.

First Embodiment

An electronic component incorporation substrate 1 of a first embodiment will now be described with referent to FIGS. 1 to 3.

Figure 1:
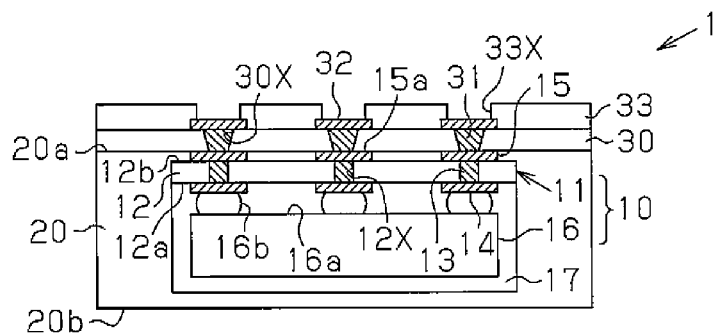
FIG. 1 is a schematic cross-sectional view showing an electronic component incorporation substrate of a first embodiment.

As shown in FIG. 1, the electronic component incorporation substrate 1 (semiconductor device) includes a first structure 10, a sealing resin 17 (first sealing resin), a sealing resin 20 (second sealing resin), an insulation layer 30, vias 31, a wiring pattern 32, and a solder resist layer 33.

The first structure 10 includes a substrate 11 and an electronic component 16 arranged on the substrate.

The substrate 11 includes a substrate body 12, a through via 13, and wiring patterns 14 and 15. A glass epoxy substrate may be used as the substrate body 12. Through holes 12X are formed at certain locations (three locations in FIG. 1) in the substrate body 12. The through holes 12X extend through the substrate body 12 from a surface 12a to a surface 12b.

The through vias 13 includes the through holes 12X. Each through via 13 has a first end connected to the wiring pattern 14 and a second end connected to the wiring pattern 15.

The wiring pattern 14 is formed on the surface 12a of the substrate body 12 (surface for mounting electronic component 16). The wiring pattern 15 is formed on the surface 12b of the substrate body 12 (surface on opposite side of mounting surface). The through vias 13 electrically connect the wiring patterns 14 and 15 to each other. Copper (Cu) can be used as the material for the through via 13 and the wiring patterns 14 and 15.

A solder 16b is formed on a circuit forming surface 16a (upper surface in FIG. 1) of the electronic component 16. The electronic component 16 is arranged (mounted) on the substrate 11 and electrically connected to the wiring pattern 14 of the substrate 11 through the solder 16b. Thus, the solder 16b of the electronic component 16 is electrically connected to the wiring pattern 15 through the wiring pattern 14 and the vias 13. In other words, the solder 16b of the electronic component 16 is converted to the wiring pattern 15 (e.g., Cu pad) through the substrate 11. A semiconductor chip, a chip resistor, a chip capacitor, a crystal oscillator, or the like may be used as the electronic component 16.

The sealing resin 17 is arranged on the surface 12a of the substrate body 12 to seal the first structure 10 (specifically, the electronic component 16, solder 16b, and wiring pattern 14 of the substrate 11). Epoxy resin containing an inorganic filler may be used as the material for the sealing resin 17. The sealing resin 17 is not limited to a liquid-form and may be in a tablet-form or powder-form. The sealing resin 17 may be filled using processes, such as transfer molding, compression molding, injection molding, and potting. Alternatively, the sealing resin 17 may be filled by applying resin paste through a printing process.

The sealing resin 20 is arranged to further seal the first structure sealed by the sealing resin 17. The surface 20a (upper surface in FIG. 1) of the sealing resin 20 is flush with the surface 15a (upper surface in FIG. 1) of the wiring pattern 15. Thus, the surface 15a of the wiring pattern 15 is exposed from the sealing resin 20. The surface 20b (resin sealing surface) of the sealing resin 20 is formed to become a smooth surface. Epoxy resin containing an inorganic filler may be used as the material for the sealing resin 20. The sealing resin 20 is not limited to a liquid-form and may be in a tablet-form or powder-form. The method of filing the sealing resin 20 may be performed using methods such as transfer molding, compression molding, injection molding, and potting. Alternatively, the method of filling the sealing resin 20 may be a method of applying resin paste through printing method.

The insulation layer 30 (insulation layer for additional wiring) is formed on the substrate 11 (wiring pattern 15) and the sealing resin 20. Specifically, the insulation layer 30 is formed to cover the surface 20a of the sealing resin 20 and the surface 15a of the wiring pattern 15. The insulation layer 30 includes the via hole 30X that reaches the wiring pattern 15 at the predetermined location. The via hole 30X is filled with a conductor (via 31). A material having photosensitivity and a material that does not have photosensitivity can be used as the material for the insulation layer 30. A sheet-like insulating resin, a paste-like insulating resin, a build up resin (epoxy resin with filter or epoxy resin without filler), liquid crystal polymer, or the like in a B-stage state (half-cured state) having viscosity and adhesiveness can be used for the insulation layer 30.

The wiring pattern 32 (additional wiring) is formed on the upper surface of the insulation layer 30. The wiring pattern 32 is electrically connected to the vias 31 described above. The wiring pattern 32 is thus electrically connected to the electronic component 16 through the vias 31, the wiring pattern 15, the through vias 13, the wiring pattern 14, and the solder 16b. Copper can be used as the material for the vias 31 and the wiring pattern 32.

The solder resist layer 33 is arranged on the upper surface of the insulation layer 30 to cover the wiring pattern 32. The solder resist layer 33 includes an opening 33X, which exposes part of the wiring pattern 32. The portion of the wiring pattern 32 exposed from the opening 33X functions as an electrode pad for connecting with other substrates, and the like. An insulating resin of epoxy series of acrylic series may be used as the material for the solder resist layer 33.

The wiring pattern 32 is illustrated as the outermost wiring layer in the illustrated example for the sake of brevity but may be one wiring layer of the buildup layer formed on the upper surface of the sealing resin 20 in accordance with the function required for the electronic component incorporation substrate 1 and the like. In other words, the wiring layer of the outermost layer may be formed after forming a predetermined number of build up layers when necessary.

The manufacturing method of the electronic component incorporation substrate 1 will now be described with reference to FIGS. 2 and 3.

The first structure 10 (more specifically, first structure 10 sealed by sealing resin 17) is first prepared. The first structure 10 can be manufactured in the following manner.

Figure 2A:
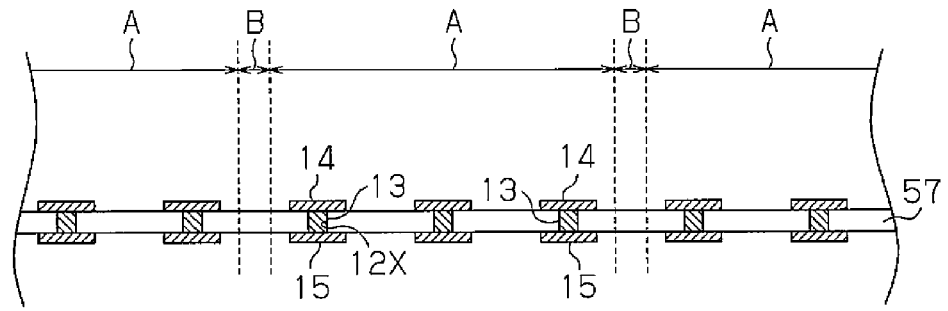
FIGS. 2(a) to 2(c) are schematic cross-sectional views showing a manufacturing method of the electronic component incorporation substrate of the first embodiment.
Figure 2B:
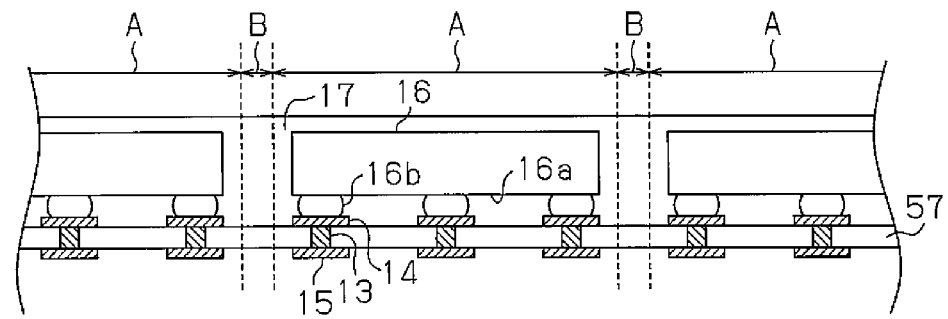
Figure 2C:
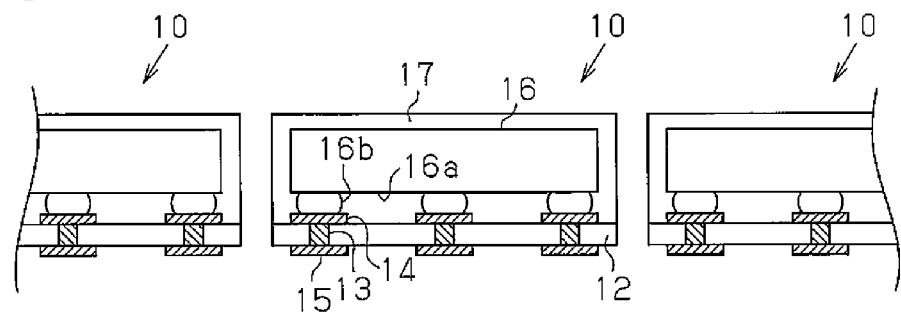
Figure 3A:
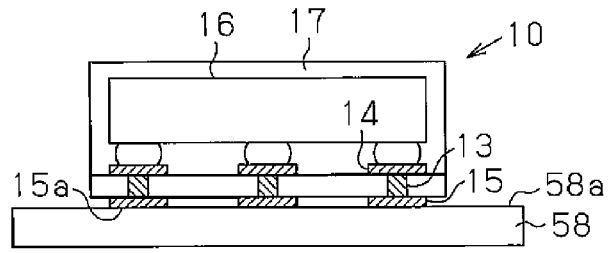
FIGS. 3(a) to 3(e) are schematic cross-sectional views showing the manufacturing method of the electronic component incorporation substrate of the first embodiment.
Figure 3B:
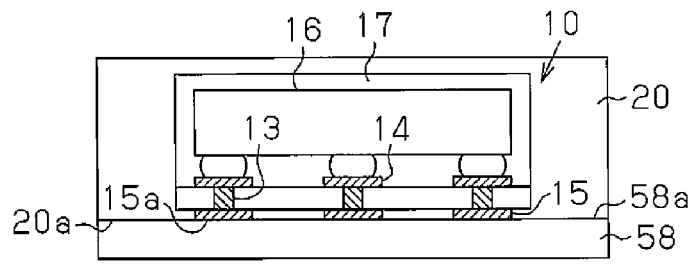
Figure 3C:
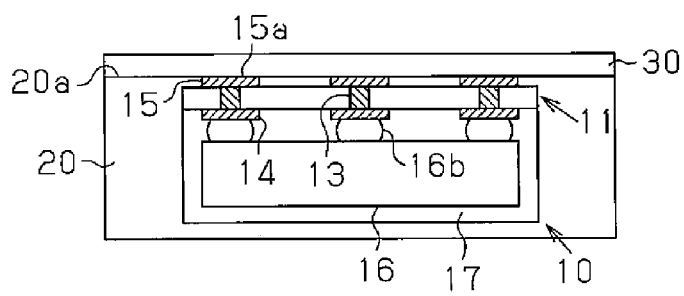
Figure 3D:
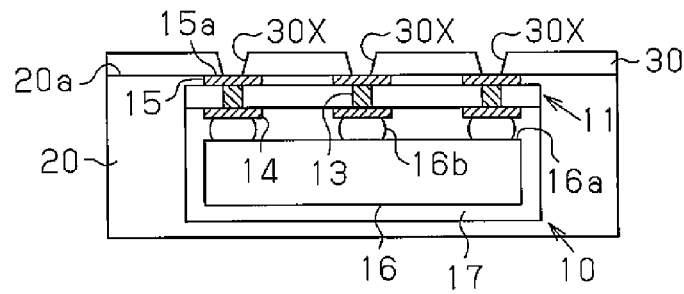
Figure 3E:
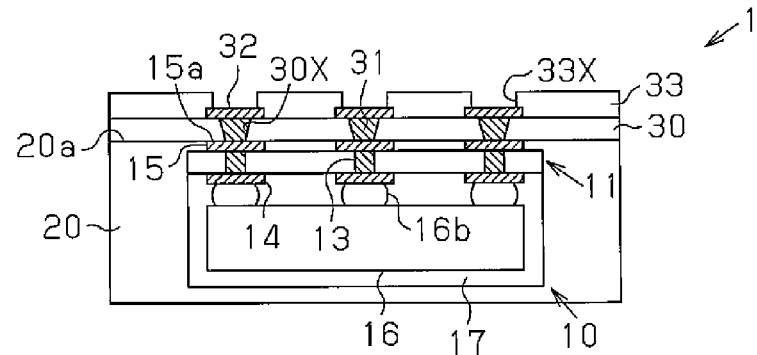

First, in the step shown in FIG. 2(*a*), a substrate 57 including a plurality of regions A where the first structure 10 is to be formed is prepared. The plurality of regions A is separated by a cutting region B. The substrate 57 becomes a plurality of substrate bodies 12 by cutting the portion corresponding to the cutting region B in the step shown in FIG. 2(*c*), to be described later. The glass epoxy substrate can be used for the substrate 57. Referring to FIG. 2(*a*), the through hole 12X, the through via 13, and the wiring patterns 14 and 15 are formed on the substrate 57 of the portion corresponding to the region A using a known technique.

As shown in FIG. 2(*b*), the electronic component 16 is then mounted (arranged) on the substrate 57. Specifically, the electronic component 16 is arranged on the substrate 57 by electrically connecting the electronic component 16 to the wiring pattern 14 of the substrate 57 through the solder 16*b*. Then, the sealing resin 17 is formed on the substrate 57 to seal the electronic component 16, the solder 16*b*, and the wiring pattern 14 (first sealing step). The epoxy mold resin formed through the transfer molding process may be used for the sealing resin 17.

Subsequently, as shown in FIG. 2(*c*), the sealing resin 17 and the substrate 57 of the portion corresponding to the cutting region B are cut by a dicing blade or the like. This manufactures a plurality of first structures 10 sealed by the sealing resin 17.

In the step (fixing step) shown in FIG. 3(*a*), a support body 58 is prepared. The first structure 10 is arranged on a surface 58*a* of the support body 58 so that the surface 58*a* of the support body 58 and the surface 15*a* of the wiring pattern 15 of the first structure 10 face each other. The surface 58*a* of the support body 58 is viscid, and hence the first structure 10 arranged thereon is fixed. If the surface 58*a* of the support body 58 is not viscid, an adhesive tape is applied to the surface 58*a* so that the surface becomes viscid when fixing the first structure 10. A PET (polyethylene terephtalate) film, PI (polyimide) film, PEN (polyethylene naphtalate) film, metal plate, glass plate, or the like can be used as the support body 58.

Then, referring to FIG. 3(*b*), the first structure 10 sealed by the sealing resin 17 has the sealing resin 20 formed on the surface 58*a* of the support body 58 for further sealing (second sealing step). The sealing resin 20 can be formed by carrying out compression forming through heating and pressing using a mold for molding (upper mold and lower mold). In this case, the surface 20*a* of the sealing resin 20 is flush with the surface 15*a* of the wiring pattern 15 since the sealing resin 20 includes the first structure 10 fixed on the support body 58.

Referring to FIG. 3(*c*), the support body 58 is then removed. A roughening process is performed, and the insulation layer 30 is formed on the surface 20*a* of the sealing resin 20 to cover the surface 20*a* of the sealing resin 20 and the surface 15*a* of the wiring pattern 15 (insulation layer forming step). As one example of a method for forming the insulation layer 30, a resin film such as epoxy resin is laminated to cover the surface 20*a* of the sealing resin 20 and the surface 15*a* of the wiring pattern 15. Then thermal processing may be carried out at a temperature of about 190° C. and curing is performed. This forms the insulation layer 30. The insulation layer 30 may also be formed by applying liquid resin of epoxy resin or the like to cover the surface 20*a* of the sealing resin 20 and the surface 15*a* of the wiring pattern 15, carrying out thermal heating at a temperature of about 190° C., and then performing curing.

As shown in FIG. 3(*d*), the via hole 30X or a through hole that extends through the insulation layer 30 is then formed using the laser processing method, or the like so that the wiring pattern 15 is exposed from the insulation layer 30. $CO_2$ laser, excimer laser, YAG laser, or the like can be used for the laser.

Thus, in the present embodiment, the via hole 30X is formed to expose the wiring pattern 15 electrically connected to the solder 16*b* of the electronic component 16 through the substrate 11. Thus, even if the via hole 30X is formed by the laser processing method, the circuit forming surface 16*a* of the electronic component 16 will not be influenced by the laser. Thus, the material having photosensitivity and the material that does not have photosensitivity can both be used as the material for the insulation layer 30. When the material having photosensitivity is used for the insulation layer 30, the via hole 30X can be formed by performing patterning through photolithography.

If the via hole 30X is formed by the laser processing method, desmear is performed on the interior of the via hole 30X to remove and clean the resin smears remaining in the via hole 30X. Potassium permanganate method, or the like can be used for the desmear.

Then, as shown in FIG. 3(*e*), the wiring pattern 32 and the via 31 are formed by the semi-additive method. In other words, a seed layer is formed to cover the insulation layer 30, the wiring pattern 15, and the inner wall of the via hole 30X, a resist having an opening pattern corresponding to the shape of the wiring pattern 32 is formed on the seed layer, and the via 31 and the wiring pattern 32 are formed by an electrolyte copper plating having the seed layer as a power supplying layer. The wiring pattern 32 is thereby electrically connected to the electronic component 16 through the via 31, the wiring pattern 15, the through via 13, the wiring pattern 14, and the solder 16*b*.

The wiring pattern 15 exposed by the via hole 30X is not the connection terminal (solder 16*b* in the present example) of the electronic component 16, but is the wiring pattern 15 electrically connected through the solder 16*b* and the substrate 11. Thus, contamination by the solder 16*b* of the electronic component 16 does not occur when performing a wet process to form the wiring pattern 32 (additional wiring). Further, the occurrence of contamination by the wiring pattern 15 can also be suppressed by appropriately selecting the surface treatment of the substrate 11 (wiring pattern 15) to arrange the electronic component 16. The electronic component 16 can thus be incorporated regardless of the surface specification of the connection terminal of the electronic component 16.

Then, referring to FIG. 3(*e*), the solder resist layer 33 having an opening 33X, which exposes part of the wiring pattern 32, is formed to cover the wiring pattern 32 and the insulation layer 30. For instance, after forming the solder resist layer 33 to cover the wiring pattern 32 and the insulation layer 30, the solder resist layer 33 is exposed and developed by photolithography to form the opening 33X shown in FIG. 3(*e*), that is, the opening 33X, which exposes part of the wiring pattern 32. This forms the solder resist layer 33 with the opening 33X. The electronic component incorporation substrate 1 of the present embodiment is manufactured through the above manufacturing steps.

As described above, the present embodiment has the following advantages.

(1) The wiring patterns 14 and 15 formed on both surfaces of the substrate body 12 are electrically connected through the through via 13. The electronic component 16 is mounted on the wiring pattern 14. Further, the wiring pattern 32 (additional wiring) is formed on the wiring pattern 15. The conductor exposed by the via hole 30X of the insulation layer 30, which is form the additional wiring, is not the connection terminal (solder 16b in the present example) of the electronic component 16, but is the wiring pattern 15 electrically connected through the solder 16b and the substrate 11. The contamination by the solder 16b of the electronic component 16 thus does not occur when performing wet processing to form the wiring pattern 32 (additional wiring). The contamination by the wiring pattern 15 is also prevented by selecting the surface treatment of the substrate 11 (wiring pattern 15) to mount the electronic component 16. The electronic component 16 is thus incorporated regardless of the surface specification of the connection terminal of the electronic component 16. This increases the degree of freedom for selecting the material.

(2) Further, the via hole 30X is formed in the insulation layer 30, which is used for the additional wiring, to expose the wiring pattern 15 electrically connected to the solder 16b of the electronic component 16. Thus, the circuit forming surface 16a and the like of the electronic component 16 are not affected by laser even when laser is used to form the via hole 30X. A material having photosensitivity and a material that does not have photosensitivity may both be used as the material for the insulation layer 30. In other words, the degree of freedom for selecting the material of the insulation layer 30 is increased.

Second Embodiment

An electronic component incorporation substrate 2 of a second embodiment will now be described with reference to FIGS. 4 to 6. Like or same reference numerals are given to those components that are the same as the corresponding components shown in FIGS. 1 to 3, and such components will not be described in detail.

Figure 4:
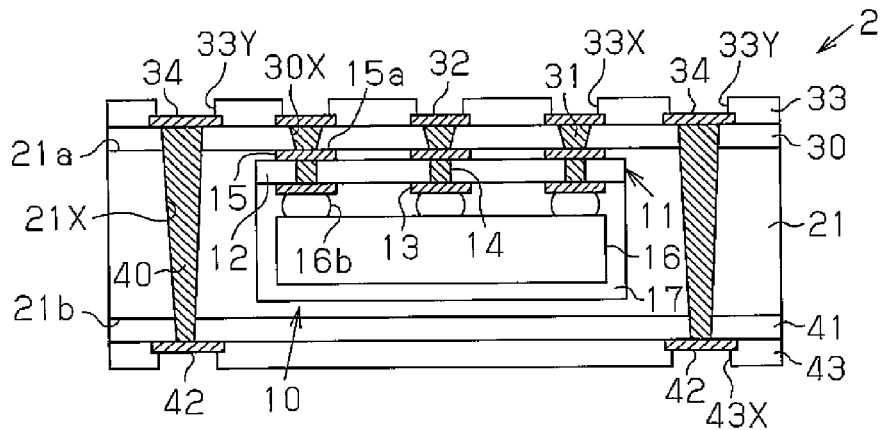
FIG. 4 is a schematic cross-sectional view showing an electronic component incorporation substrate of a second embodiment.

As shown in FIG. 4, the electronic component incorporation substrate 2 includes the first structure 10, the sealing resin 17, a sealing resin 21, the insulation layer 30, the via 31, the wiring pattern 32, the solder resist layer 33, an upper wiring 34, a through via 40, an insulation layer 41, a lower wiring 42, and a solder resist layer 43.

The sealing resin 21 is arranged to further seal the first structure sealed by the sealing resin 17. The surface 21a of the sealing resin 21 is flush with the surface 15a of the wiring pattern 15 of the first structure 10. Thus, the surface 15a of the wiring pattern 15 is exposed from the sealing resin 21.

The insulation layer 30 is formed on the substrate 11 (wiring pattern 15) and the sealing resin 21. Specifically, the insulation layer 30 is formed to cover the surface 21a of the sealing resin 21 and the surface 15a of the wiring pattern 15. The insulation layer 41 is formed to cover the surface 21b (resin sealing surface) of the sealing resin 21. The insulation layers 30, 41 and the sealing resin 21 include a through hole 21X.

The through via 40 is formed in the through hole 21X. The first end of the through via 40 is connected to the upper wiring 34, and the second end of the through via 40 is connected to the lower wiring 42. Copper can be used as the material for the through via 40.

In the same manner as the wiring pattern 32, the upper wiring 34 is formed on the upper surface of the insulation layer 30. The upper wiring 34 is electrically connected to the through via 40.

The lower wiring 42 is formed on the lower surface of the insulation layer 41. The lower wiring 42 is electrically connected to the through via 40. The upper wiring 34 and the lower wiring 42 are electrically connected to each other through the through via 40. Therefore, the first surface side (surface 21a side) and the second surface side (surface 21b side) of the sealing resin 21 are electrically connected through the through via 40 that extends through the sealing resin 21. Copper can be used as the material for the upper wiring 34 and the lower wiring 42.

The solder resist layer 33 is arranged on the upper surface of the insulation layer 30 to cover the wiring pattern 32 and the upper wiring 34. The solder resist layer 33 includes the opening 33X, which exposes part of the wiring pattern 32, and an opening 33Y, which exposes part of the upper wiring 34. The portions of the wiring pattern 32 and the upper wiring 34 exposed from the openings 33X and 33Y function as electrode pads connected to other substrates or the like.

The solder resist layer 43 is arranged on the lower surface of the insulation layer 41 to cover the lower wiring 42. The solder resist layer 43 includes an opening 43X, which exposes part of the lower wiring 42. The portion of the lower wiring 42 exposed from the opening 43X functions as an electrode pad connected to other substrates or the like. An insulating resin of epoxy series or acrylic series may be used as the material for the solder resist layer 43.

The wiring pattern 32 and the upper wiring 34 are illustrated as the outermost wiring layers but may be just one wiring layer of the buildup layer formed on the surface 21a of the sealing resin 21 in accordance with the function required for the electronic component incorporation substrate 2 or the like. In other words, the wiring layer of the outermost layer may be formed after forming a predetermined number of build up layers.

The lower wiring 42 is illustrated as the outermost wiring layer but may be just one wiring layer of the buildup layer formed on the surface 21b of the sealing resin 21 in accordance with the function required for the electronic component incorporation substrate 2 or the like. In other words, the wiring layer of the outermost layer may be formed after forming a predetermined number of build up layers.

The manufacturing method of the electronic component incorporation substrate 2 will now be described with reference to FIGS. 5 and 6.

Figure 5A:
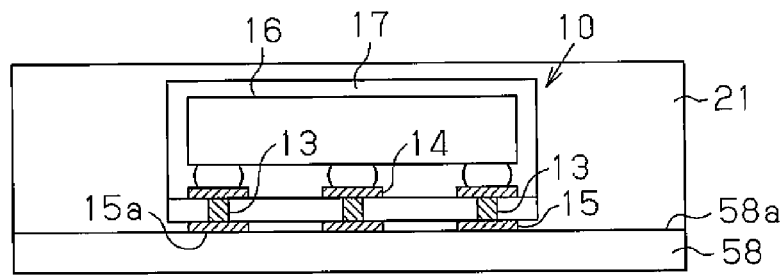
FIGS. 5(a) and 5(b) are schematic cross-sectional views showing a manufacturing method of the electronic component incorporation substrate of the second embodiment.

As shown in FIG. 5(a), the first structure 10 is fixed on a surface 58a of the support body 58 so that the surface 58a of the support body 58 and the surface 15a of the wiring pattern 15 of the first structure 10 face each other. Then, the sealing resin 21 is formed on the surface 58a of the support body 58 to seal the first structure 10 through a method in the same manner as the first embodiment.

Figure 5B:
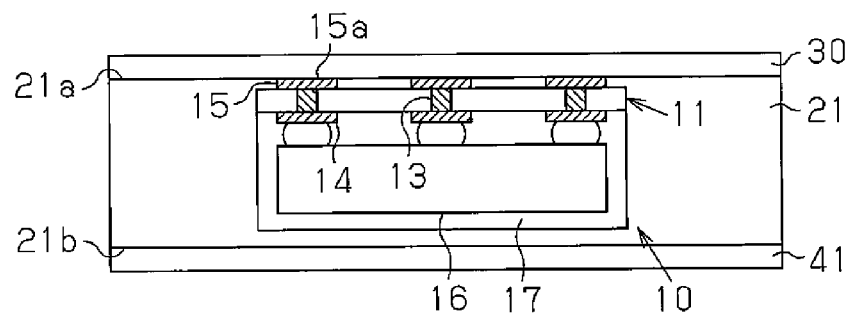

Referring to FIG. 5(b), the support body 58 is then removed. A roughening process is then performed, and the insulation layer 30 is formed to cover the surface 21a of the sealing resin 21 and the surface 15a of the wiring pattern 15, and the insulation layer 41 is formed to cover the surface 21b of the sealing resin 21. As one example of a method for forming the insulation layer 41, a resin film such as epoxy resin is laminated to cover the surface 21b of the sealing resin 21, thermal processing is carried out at a temperature of about 190° C., and curing is then performed. This forms the insulation layer 41. The insulation layer 41 may also be formed by applying liquid resin of epoxy resin or the like to cover the surface 21b of the sealing resin 21, carrying out thermal heating at a temperature of about 190° C., and then performing curing. The insulation layer 41 may also be formed by photolithography, screen printing, or the like.

Figure 6A:
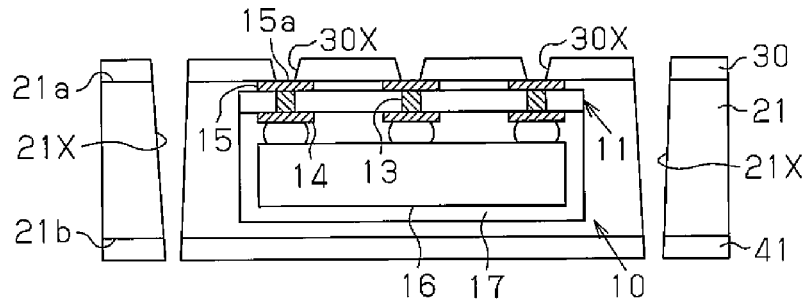
FIGS. 6(a) to 6(d) are schematic cross-sectional views showing the manufacturing method of the electronic component incorporation substrate of the second embodiment.

Referring to FIG. 6(a), the via hole 30X that extends through the insulation layer 30 is then formed by performing laser processing or the like so that part of the wiring pattern 15 is exposed. The through hole 21X that extends through the insulation layers 30 and 41 and the sealing resin 21 is further formed in the sealing resin 21 and the insulation layers 30 and 41. Such a through hole 21X can be formed by performing laser processing, machine drill processing, router processing, or the like.

Figure 6B:
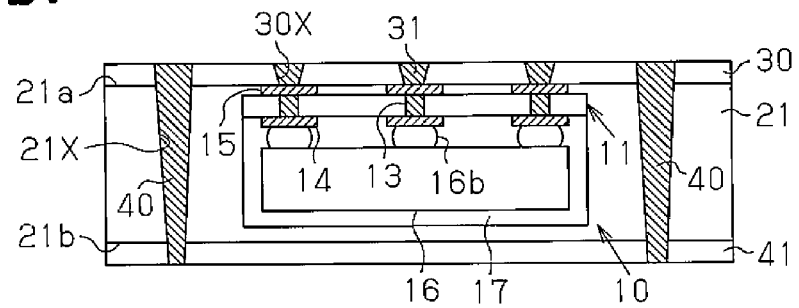
Figure 6C:
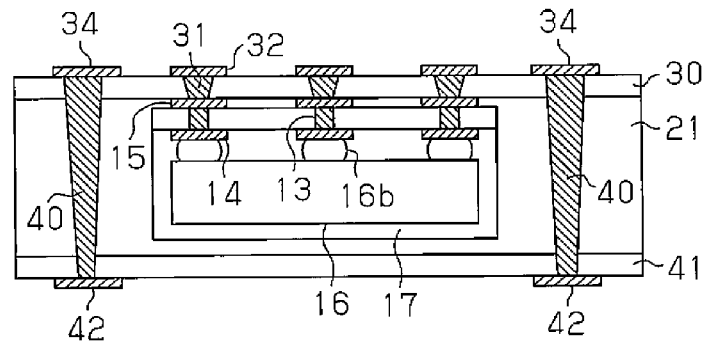

Thereafter, referring to FIG. 6(b), the via 31 is formed in the via hole 30X and the through via 40 is formed in the through hole 21X through methods such as copper plating or screen printing after the desmear. Then, referring to FIG. 6(c), the wiring pattern 32 and the upper wiring 34 are formed on the upper surface of the insulation layer 30 and the lower wiring 42 is formed on the lower surface of the insulation layer 41 by the semi-additive method.

Figure 6D:
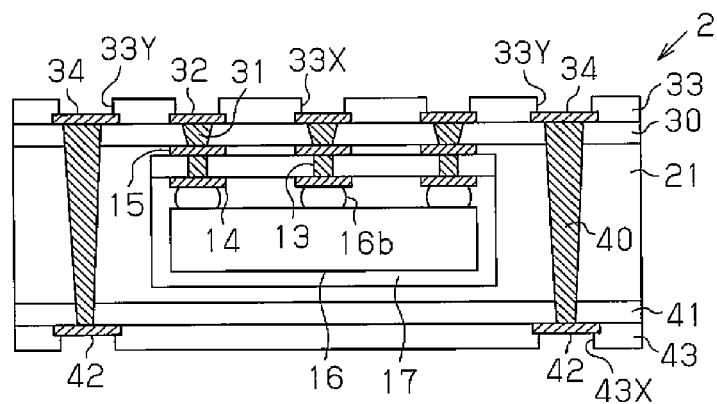

Then, referring to FIG. 6(d), the solder resist layer 33 having the openings 33X and 33Y, which respectively expose parts of the wiring pattern 32 and the upper wiring 34, is formed to cover the wiring pattern 32, the upper wiring 34, and the insulation layer 30. The solder resist layer 43 having the opening 43X, which exposes part of the lower wiring 42, is then formed to cover the lower wiring 42 and the insulation layer 41. For instance, after forming the solder resist layer 43 to cover the lower wiring 42 and the insulation layer 41, the solder resist layer 43 is exposed and developed by photolithography to form the opening 43X shown in FIG. 6(d), that is, the opening 43X, which exposes part of the lower wiring 42. The electronic component incorporation substrate 2 of the present embodiment is manufactured through the above manufacturing steps.

The present embodiment described above has the same advantages as the first embodiment.

Third Embodiment

A third embodiment of an electronic component incorporation substrate 3 will now be described with reference to FIGS. 7 to 10. Like or same reference numerals are given to those components that are the same as the corresponding components shown in FIGS. 1 to 6, and such components will not be described in detail.

Figure 7:
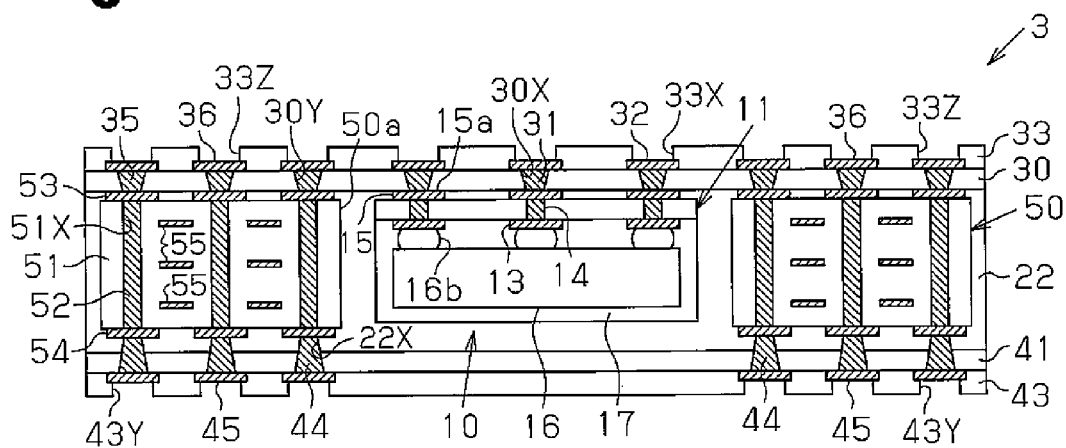
FIG. 7 is a schematic cross-sectional view showing an electronic component incorporation substrate of a third embodiment.

As shown in FIG. 7, the electronic component incorporation substrate 3 includes the first structure 10, the sealing resin 17, a substrate 50, a sealing resin 22, the insulation layers 30 and 41, the vias 31 and 35, the wiring pattern 32, the solder resist layers 33 and 43, an upper wiring 36, a via 44, and a lower wiring 45.

The substrate 50 is a multi-layered print wiring board. The substrate 50 is a multi-layered substrate including wiring patterns of five layers in which a substrate body 51, a through via 52, wirings 53 and 54 on the outer surface of the substrate body 51, and a wiring 55 on an inner layer of the substrate body 51 are combined.

The substrate body 51 includes through holes 51X at certain locations (six locations in FIG. 7). The through holes 51X extend through the substrate body 51 from an upper surface to a lower surface. For example, a glass fabric base material epoxy resin copper clad laminate can be used as the substrate body 51.

The through via 52 is arranged in the through hole 51X. The first end of the through via 52 is connected to the wiring 53, and the second end of the through via 52 is connected to the wiring 54. In other words, the through via 52 is electrically connected to the first surface (upper surface side) and the second surface (lower surface side) of the substrate 50.

The wiring 53 is formed on the first surface (upper surface in FIG. 7) of the substrate body 51. The wiring 54 is formed on the second surface (lower surface in FIG. 7) of the substrate body 51. The wirings 53 and 54 are electrically connected to each other through the through via 52. Copper can be used as the material for the wirings 53, 54 and the through via 52. The wiring 55 on the inner layer of the substrate body 51 includes a power supply wiring and a ground layer.

Figure 8:
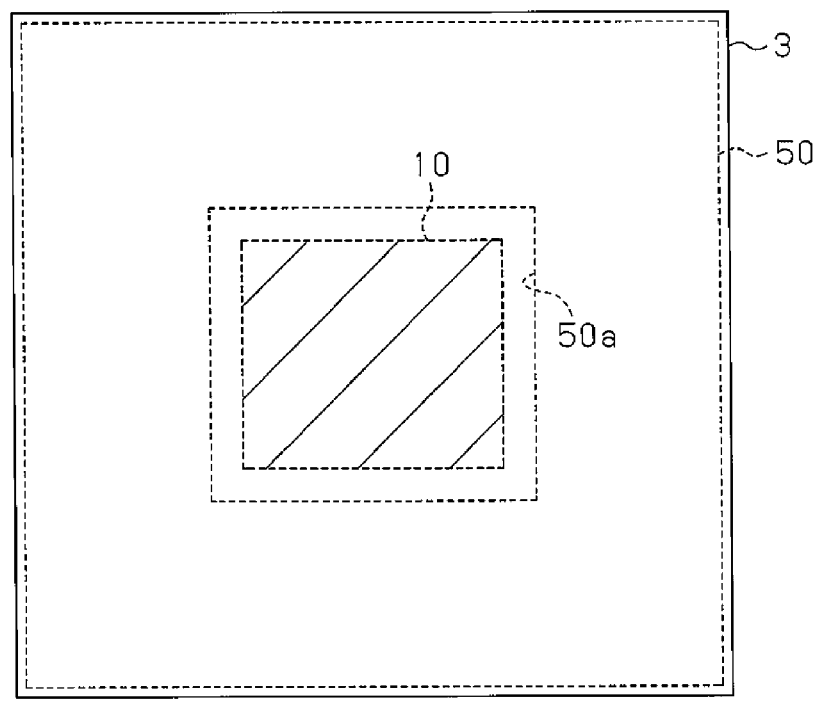
FIG. 8 is a schematic plan view showing the electronic component incorporation substrate of the third embodiment.

The substrate 50 includes an opening 50a at a position corresponding to the layout position at where the first structure 10 is arranged (incorporated). In the substrate 50 of the present embodiment, a square opening 50a is formed at the central part, as shown in FIG. 8. The opening 50a is larger than the outer shape of the first structure 10. The substrate 50 is arranged such that the opening 50a of the substrate 50 faces the first structure 10.

As shown in FIG. 7, the sealing resin 22 is arranged to seal the first structure 10 and the substrate 50 sealed by the sealing resin 17. The upper surface of the sealing resin 22 is flush with the upper surfaces of the wiring pattern 15 and the wiring 53. Thus, the wiring pattern 15 and the wiring 53 are exposed from the sealing resin 22.

The insulation layer 30 is formed on the sealing resin 22, the substrate 11 (wiring pattern 15) and the substrate 50 (wiring 53). Specifically, the insulation layer 30 is formed to cover the first surface (upper surface in FIG. 7) of the sealing resin 22, the wiring pattern 15, and the wiring 53. The insulation layer 30 includes the via hole 30X that reaches the wiring pattern 15, and a via hole 30Y that reaches the wiring 53 at the predetermined location. The via holes 30X and 30Y are respectively filled with the vias 31 and 35.

The insulation layer 41 is formed to cover the second surface (lower surface in FIG. 7) of the sealing resin 22. The insulation layer 41 and the sealing resin 22 include the via hole 22X that reaches the wiring 54 at the predetermined location. The via hole 22X is filled with the via 44.

In the same manner as the wiring pattern 32, the upper wiring 36 is formed on the upper surface of the insulation layer 30. The upper wiring 36 is electrically connected with the via 35 filled in the via hole 30Y.

The lower wiring 45 is formed on the lower surface of the insulation layer 41. The lower wiring 45 is electrically connected with the via 44 filled in the via hole 22X. The lower wiring 45 is thus electrically connected with the upper wiring 36 through the via 44, the wiring 54, the through via 52, the wiring 53, and the via 35. In other words, the first surface (upper surface) and the second surface (lower surface) of the sealing resin 22 are electrically connected through the through via 52 of the substrate 50. More specifically, the upper wiring 36 and the lower wiring 45 are electrically connected to each other using the wirings 53 and 54 electrically connected through the through via 52 of the substrate 50. Copper can be used as the material for the upper wiring 36 and the lower wiring 45.

The solder resist layer 33 is arranged on the upper surface of the insulation layer 30 to cover the wiring pattern 32 and the upper wiring 36. The solder resist layer 33 includes the opening 33X, which exposes part of the wiring pattern 15, and an opening 33Z, which exposes part of the upper wiring 36. The portions of the wiring pattern 32 and the upper wiring 36 exposed from the openings 33X and 33Z function as electrode pads connected to other substrates or the like.

The solder resist layer 43 is arranged on the lower surface of the insulation layer 41 to cover the lower wiring 45. The solder resist layer 43 includes an opening 43Y, which exposes part of the lower wiring 45. The lower wiring 45 of the portion exposed from the opening 43Y functions as an electrode pad connecting to other substrates.

The manufacturing method of the electronic component incorporation substrate 3 will now be described with reference to FIGS. 9 and 10.

Figure 9A:
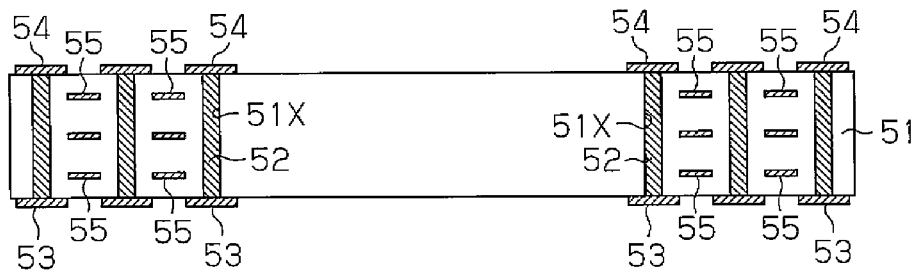
FIGS. 9(a) to 9(d) are schematic cross-sectional views showing a manufacturing method of the electronic component incorporation substrate of the third embodiment.
Figure 9B:

First, the substrate 50 is prepared. The substrate 50 can be manufactured in the following manner. Referring to FIG. 9(a), the print wiring board including the wirings 53, 54 on the outer surface of the substrate body 51, the wiring 55 on the inner layer of the substrate body 51, and the through via 52 is formed using a known technique. Then, as shown in FIG. 9(b), the opening 50a for opening the position corresponding to the layout position of the first structure 10 is formed in the print wiring board shown in FIG. 9(a) to manufacture the substrate 50. The opening 50a may be formed through laser processing, machine drill processing, router processing, or the like.

Figure 9C:
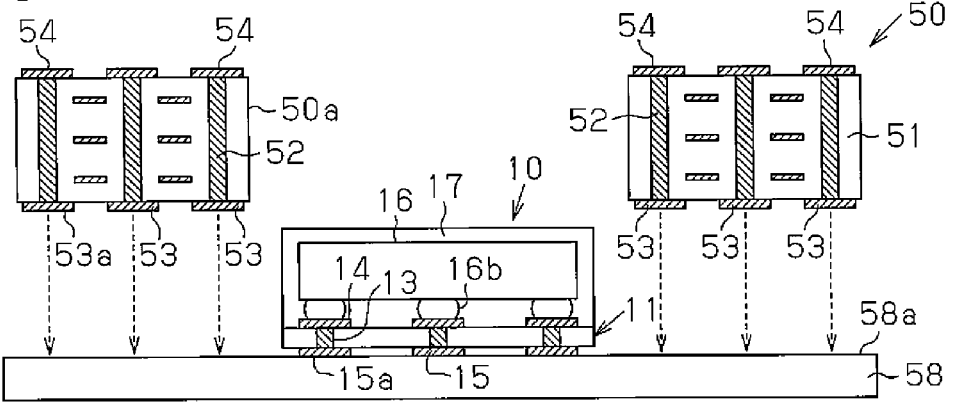

In the step (fixing step) shown in FIG. 9(c), the support body 58 is prepared. The first structure 10 is fixed on the surface 58a (adhesive surface) of the support body 58 so that the surface 58a of the support body 58 and the surface 15a of the wiring pattern 15 of the first structure 10 face each other. The substrate 50 is further fixed on the surface 58a of the support body 58 so that the support surface 58a of the support body 58 and the surface 53a of the wiring 53 of the substrate 50 face each other and so that the opening 50a faces the first structure 10.

Figure 9D:
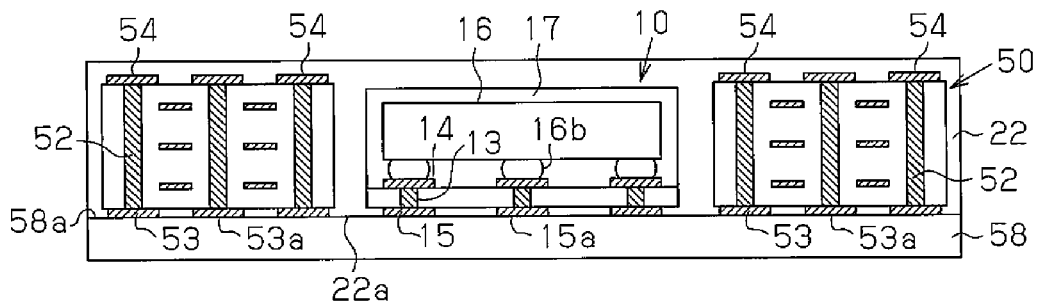

Then, referring to FIG. 9(d), the sealing resin 22 is formed on the surface 58a of the support body 58 to seal the first structure 10 and the substrate 50 fixed on the support body 58 (second sealing step). The sealing resin 22 can be formed by carrying out compression forming by performing heating and pressing using a mold for molding (upper mold and lower mold). In this case, the surface 22a of the sealing resin 22 is flush with the surface 15a of the wiring pattern 15 and the surface 53a of the wiring 53 since the sealing resin 22 includes the first structure 10 and the substrate 50 fixed on the support body 58.

Figure 10A:
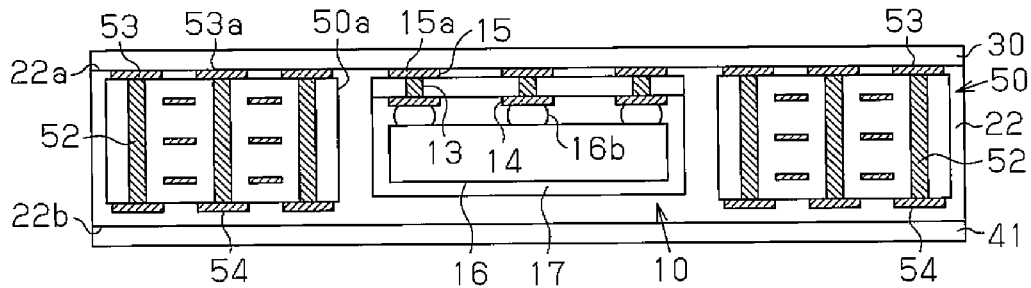
FIGS. 10(a) to 10(d) are schematic cross-sectional views showing the manufacturing method of the electronic component incorporation substrate of the third embodiment.

Then, as shown in FIG. 10(a), the support body 58 is removed, and the insulation layer 30 is formed to cover the surface 22a of the sealing resin 22, the surface 15a of the wiring pattern 15, and the surface 53a of the wiring 53 (insulation layer forming step). The insulation layer 41 is formed to cover the surface 22b of the sealing resin 22.

Figure 10B:
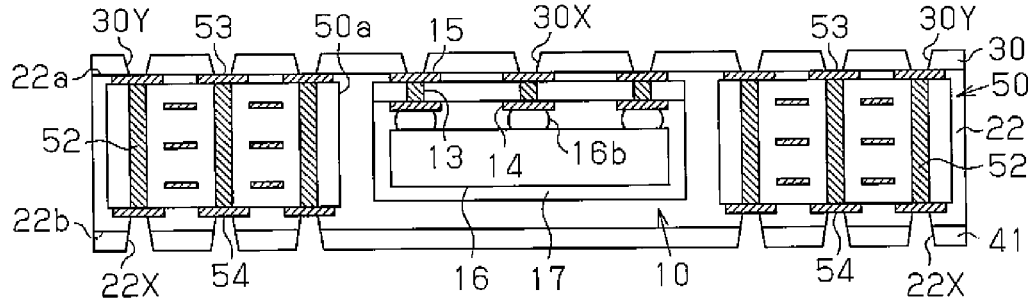

Referring to FIG. 10(b), the via hole 30X that extends through the insulation layer 30 is then formed to expose part of the wiring pattern 15 of the first structure 10. The via hole 30Y that extends through the insulation layer 30 is also formed to expose part of the wiring 53 of the substrate 50. Moreover, the via hole 22X is formed in the sealing resin 22 and the insulation layer 41 to expose part of the wiring 54 of the substrate 50. The via holes 30X, 30Y, and 22X can be formed by laser processing or the like. $CO_2$ laser, excimer laser, YAG laser, or the like can be used as the laser.

Figure 10C:
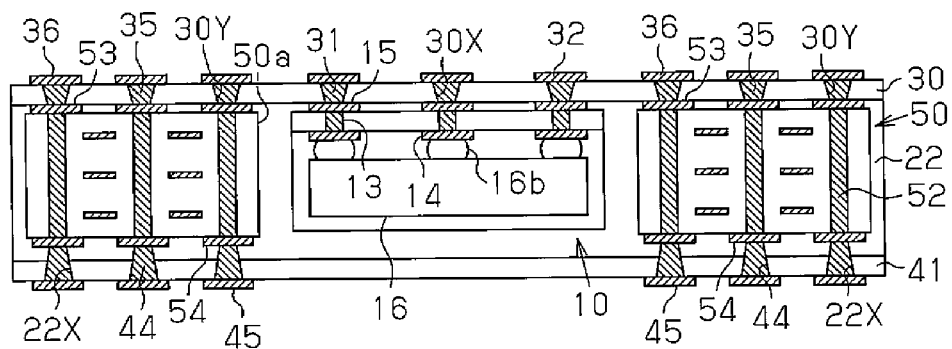

Referring to FIG. 10(c), the vias 31 and 35, the wiring pattern 32, and the upper wiring 36 are formed on the upper surface of the insulation layer 30 through the semi-additive method after the desmear. The via 44 and the lower wiring 45 are also formed on the lower surface of the insulation layer 41 through the semi-additive method. The wiring pattern 32 is thus electrically connected to the electronic component 16 through the via 31, the wiring pattern 15, the through via 13, the wiring pattern 14, and the solder 16b. The upper wiring 36 is electrically connected to the lower wiring 45 through the via 35, the wiring 53, the through via 52, the wiring 54, and the via 44.

Figure 10D:
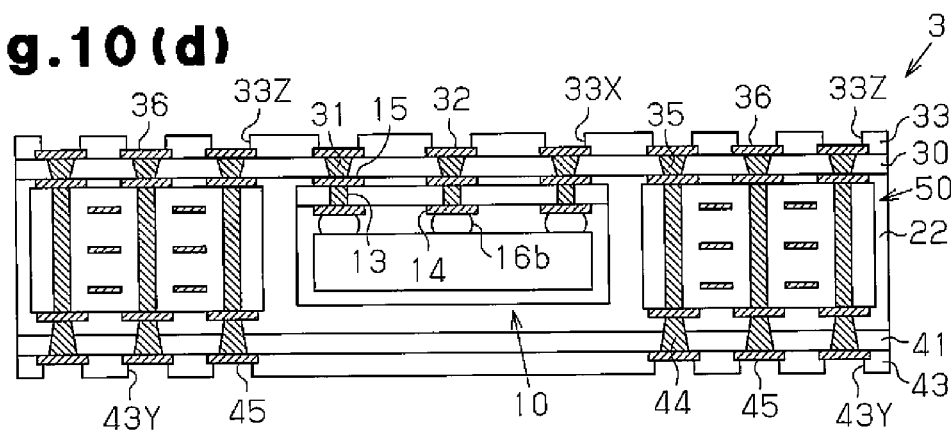

Then, as shown in FIG. 10(d), the solder resist layer 33 having the openings 33X and 33Z, which respectively expose parts of the wiring pattern 32 and the upper wiring 36, is formed to cover the wiring pattern 32, the upper wiring 36, and the insulation layer 30. The solder resist layer 43 having the opening 43Y, which exposes part of the lower wiring 45, is then formed to cover the lower wiring 45 and the insulation layer 41. The electronic component incorporation substrate 3 of the second embodiment is manufactured through the above manufacturing steps.

The above embodiment has the following advantage in addition to the advantages (1) and (2) of the first embodiment.

(3) The electronic component incorporation substrate 3 incorporates the substrate 50 in which the wirings 53 and 54 formed on both surfaces (upper and lower surfaces) of the substrate body 51 are electrically connected through the through via 52 in the substrate body 51. The upper wiring 36 and the lower wiring 45 formed on both surfaces of the electronic component incorporation substrate 3 are electrically connected to each other using the through via 52 of the substrate 50 and the wirings 53 and 54. The upper wiring 36 and the lower wiring 45 are thus electrically connected without forming a through hole that extends through the sealing resin 22.

When the height of the incorporating electronic component 16 increases, the height of the sealing resin 22 for sealing the electronic component 16 also increases. In this case, it is difficult to form the through hole in the sealing resin 22 to electrically connect the upper and lower surfaces of the sealing resin 22 (to electrically connect the upper wiring 36 and the lower wiring 45). For instance, when forming the through hole in the sealing resin 22 through laser processing, it is difficult to form a straight hole with the inner wall of the through hole having satisfactory quality. When forming the through hole in the sealing resin 22 through machine drill, the processing cost for forming the through hole increases due to wear of the machine drill caused by the inorganic filler contained in the sealing resin 22. Further, even if the through hole is formed in the sealing resin 22, the manufacturing cost would increase since the application of conductivity (e.g., through-hole plating) to the inner wall of the through hole and the process of filling resin in the through hole are required.

In contrast, the electronic component incorporation substrate 3 of the present embodiment electrically connects the upper wiring 36 and the lower wiring 45 without forming the through hole that extends through the sealing resin 22. This ensures the electrical connection of the upper wiring 36 and the lower wiring 45 while preventing the occurrence of the above problems in advance even if the height of the incorporating electronic component 16 increases, that is, even if the height of the sealing resin 22 increases. The electronic component 16 is thus incorporated in the electronic component incorporation substrate 3 without being subject to restriction resulting from the height of the incorporating electronic component 16.

Fourth Embodiment

A fourth embodiment will now be described with reference to FIGS. 11 to 14.

Figure 11:
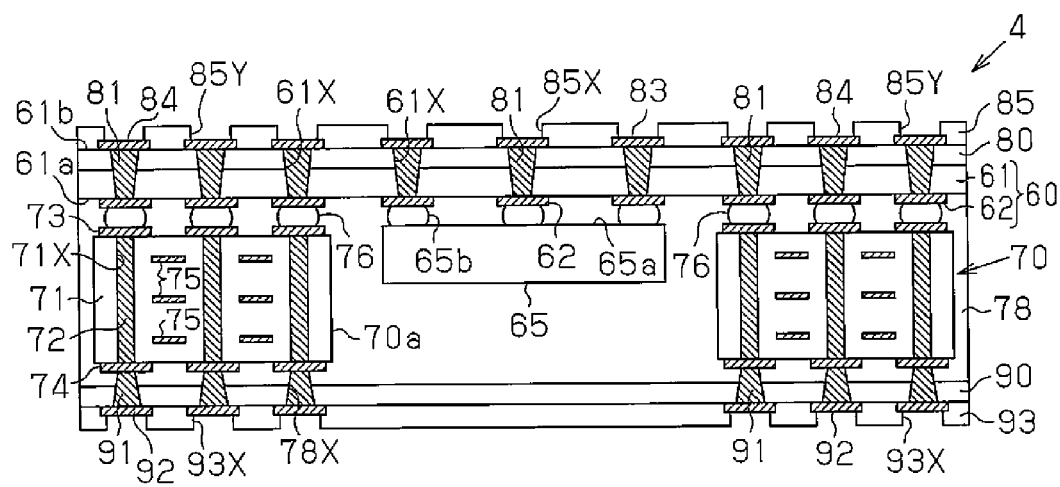
FIG. 11 is a schematic cross-sectional view showing an electronic component incorporation substrate of a fourth embodiment.

As shown in FIG. 11, the electronic component incorporation substrate 4 includes a substrate 60 (first substrate), an electronic component 65, a substrate 70 (second substrate), a sealing resin 78, insulation layers 80, 90, a via 81, a wiring pattern 83, an upper wiring 84, a via 91, a lower wiring 92, and solder resist layers 85 and 93.

The substrate 60 includes a substrate body 61 and a wiring pattern 62. The substrate body 61 is a plate-shaped member. The wiring pattern 62 is formed on a surface 61a of the substrate body 61. Copper clad laminate or the like may be used as the substrate body 61. Copper can be used as the material for the wiring pattern 62.

The electronic component 65 has a solder 65b formed on the circuit forming surface 65a (upper surface in FIG. 11). The electronic component 65 is arranged (mounted) on the substrate 60 and electrically connected to the wiring pattern 62 of the substrate 60 through the solder 65b. The solder 65b of the electronic component 65 is thereby converted to the wiring pattern 62 (e.g., Cu pad). A semiconductor chip, a chip resistor, a chip capacitor, a crystal oscillator, or the like may be used as the electronic component 65. In the present embodiment, the first structure includes the substrate 60 and the electronic component 65.

The substrate 70 is a multi-layered print wiring board. The substrate 70 is a multi-layered substrate including wiring patterns of five layers in which a substrate body 71, a through via 72, wirings 73 and 74 on the outer surface of the substrate body 71, and a wiring 75 on an inner layer of the substrate body 71 are combined.

The substrate body 71 includes through holes 71X at certain locations (six locations in FIG. 11). The through holes 71X extend through the substrate body 71 from an upper surface to a lower surface.

The through via 72 is arranged in the through hole 71X. The first end of the through via 72 is connected to the wiring 73, and the second end of the through via 72 is connected to the wiring 74. In other words, the through via 72 is electrically connected to the first surface (upper surface side) and the second surface (lower surface side) of the substrate 70.

The wiring 73 is formed on the first surface (upper surface in FIG. 11) of the substrate body 71. A solder 76 is adhered to the upper surface of the wiring 73. The wiring 74 is formed on the second surface (lower surface in FIG. 11) of the substrate body 71. The wirings 73 and 74 are electrically connected to each other through the through via 72. Copper can be used as the material for the wirings 73 and 74 and the through via 72. The wiring 75 on the inner layer includes a power supply wiring and a ground layer.

Figure 12:
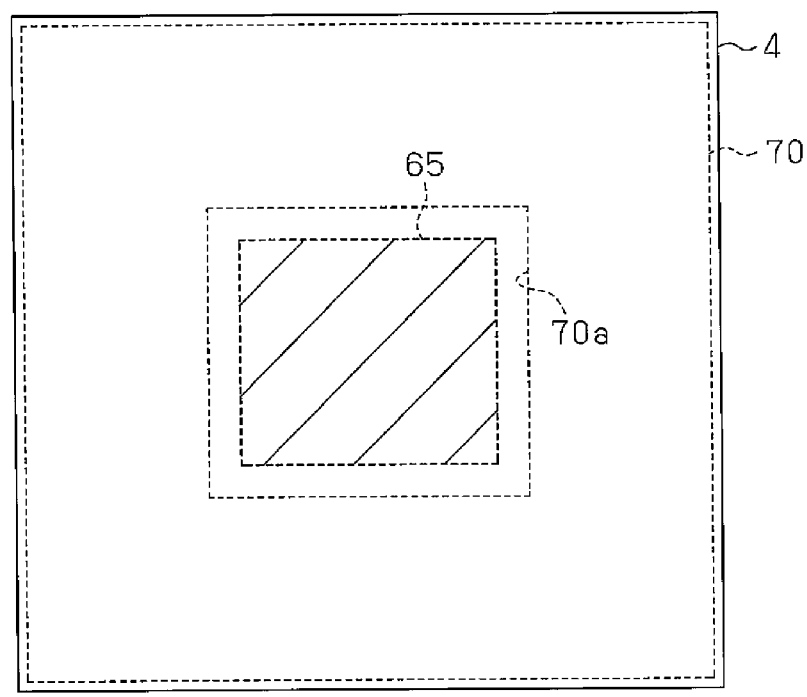
FIG. 12 is a schematic plan view showing the electronic component incorporation substrate of the fourth embodiment.

The substrate 70 includes an opening 70a at a position corresponding to the layout position at where the electronic component 65 is arranged (incorporated). In the substrate 70 of the present embodiment, a square opening 70a is formed at the central part, as shown in FIG. 12. The opening 70a is larger than the outer shape of the electronic component 65.

The substrate 70 is arranged such that the opening 70a faces the electronic component 65. The substrate 70 is arranged on the substrate 60 and electrically connected to the wiring pattern 62 of the substrate 60 through the solder 76 formed on the wiring 73.

The sealing resin 78 is arranged on the surface 61a of the substrate body 61 to seal the first structure (specifically, wiring pattern 62 and electronic component 65 of substrate 60) and the substrate 70. Epoxy resin containing an inorganic filler may be used as the material for the sealing resin 78. The form is not limited to a liquid-form and may be in a tablet-form or powder-form. The method of filing the sealing resin 78 may be performed using methods such as transfer molding, compression molding, injection molding, and potting. Alternatively, the method of filling the sealing resin 78 may be a method of applying resin paste through printing method.

The insulation layer 80 is formed on the substrate 60. Specifically, the insulation layer 80 is formed to cover the surface 61b of the substrate body 61. The insulation layer 80 and the substrate body 61 include a via hole 61X that reaches the wiring pattern 62 at the predetermined location. The via hole 61X is filled with a conductor (via 81). A material having photosensitivity and a material that does not have photosensitivity can both be used as the material for the insulation layer 80. A sheet-like insulating resin, a paste-like insulating resin, a build up resin (epoxy resin with filter or epoxy resin without filler), liquid crystal polymer, or the like in a B-stage state (half-cured state) having viscosity and adhesiveness can be used for the insulation layer 80.

The insulation layer 90 is formed to cover the resin sealing surface (lower surface in FIG. 11) of the sealing resin 78. The insulation layer 90 and the sealing resin 78 include a via hole 78X that reaches the wiring 74 at the predetermined location. The via hole 78X is filled with a via 91. A material having photosensitivity and a material that does not have photosensitivity can both be used as the material for the insulation layer 90. A sheet-like insulating resin, a paste-like insulating resin, a build up resin (epoxy resin with filter or epoxy resin without filler), liquid crystal polymer, or the like in a B-stage state (half-cured state) having viscosity and adhesiveness can be used for the insulation layer 90.

The wiring pattern 83 (additional wiring) is formed on the upper surface of the insulation layer 80. The wiring pattern 83 is electrically connected to the via 81 filled in the via hole 61X described above. The wiring pattern 83 is thus electrically connected to the electronic component 65 through the via 81, the wiring pattern 62, and the solder 65b. Copper can be used as the material for the wiring pattern 83.

The upper wiring 84 is formed on the upper surface of the insulation layer 80 in the same manner as the wiring pattern 83. The upper wiring 84 is electrically connected to the via 81 filled in the via hole 61X.

The lower wiring 92 is formed on the lower surface of the insulation layer 90. The lower wiring 92 is electrically connected to the via 91 filled in the via hole 78X. The lower wiring 92 is thus electrically connected to the upper wiring 84 through the via 91, the wiring 74, the through via 72, the wiring 73, the solder 76, the wiring pattern 62, and the via 81. In other words, the first surface side (upper surface side) and the second surface side (lower surface side) of the sealing resin 78 are electrically connected through the through via 72 of the substrate 70. More specifically, the upper wiring 84 and the lower wiring 92 are electrically connected to each other using the wirings 73 and 74 electrically connected through the through via 72 of the substrate 70. Copper can be used as the material for the upper wiring 84, the lower wiring 92, and the vias 81 and 91.

The solder resist layer 85 is arranged on the upper surface of the insulation layer 80 to cover the wiring pattern 83 and the upper wiring 84. The solder resist layer 85 includes an opening 85X, which exposes part of the wiring pattern 83, and an opening 85Y, which exposes part of the upper wiring 84. The portions of the wiring pattern 83 and the upper wiring 84 exposed from the openings 85X and 85Y function as electrode pads connected to other substrates or the like. An insulating resin of epoxy series or acrylic series may be used as the material for the solder resist layer 85.

The solder resist layer 93 is arranged on the lower surface of the insulation layer 90 to cover the lower wiring 92. The solder resist layer 93 includes an opening 93X, which exposes part of the lower wiring 92. The portion of the lower wiring 92 exposed from the opening 93X functions as an electrode pad connected to other substrates or the like. An insulating resin of epoxy series or acrylic series may be used as the material for the solder resist layer 93.

The wiring pattern 83 and the upper wiring 84 are illustrated as the outermost wiring layer but may be just one wiring layer of the buildup layer formed on the surface 61b of the substrate body 61 in accordance with the function required for the electronic component incorporation substrate 4 and the like. In other words, the wiring layer of the outermost layer may be formed after forming a predetermined number of build up layers as required.

The lower wiring 92 is illustrated as the outermost wiring layer but may be just one wiring layer of the buildup layer formed on the lower surface of the sealing resin 78 in accordance with the function required for the electronic component incorporation substrate 4 or the like. In other words, the outermost wiring layer may be formed after forming a predetermined number of build up layers as required.

The manufacturing method of the electronic component incorporation substrate 4 will now be described with reference to FIGS. 13 and 14.

First, the substrate 70 is prepared. The substrate 70 can be manufactured in the following manner. In other words, the substrate 70 is manufactured by forming a print wiring board including the wirings 73 and 74 on the outer surface of the substrate body 71, the wiring 75 on the inner layer of the substrate body 71, and the through via 72, and forming an opening 70a at a position corresponding to the layout position of the electronic component 65 in the print wiring board using a known technique. The opening 70a can be formed by laser processing, machine drill processing, router processing, or the like.

Figure 13A:
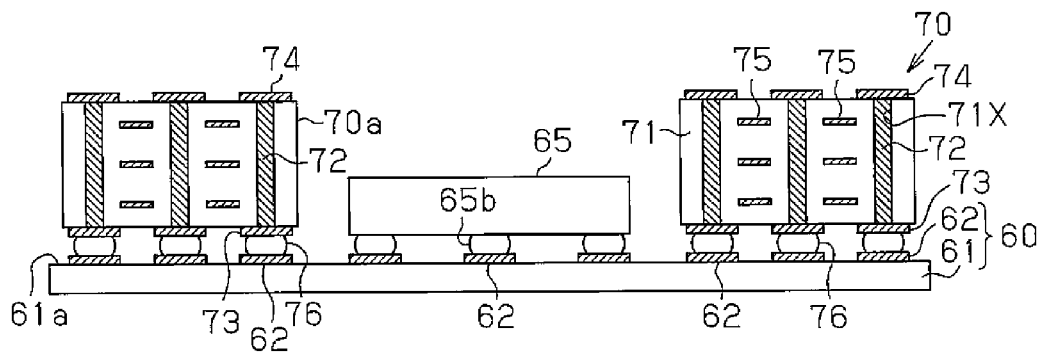
FIGS. 13(a) to 13(c) are schematic cross-sectional views showing the manufacturing method of the electronic component incorporation substrate of the fourth embodiment.

Referring to FIG. 13(a), the electronic component 65 and the substrate 70 are arranged on the substrate 60 including the wiring pattern 62. Specifically, the electronic component 65 is mounted on the substrate 60 by electrically connecting the electronic component 65 to the wiring pattern 62 of the substrate 60 through the solder 65b. The substrate 70 is mounted on the substrate 60 by electrically connecting the solder 76 formed on the wiring 73 of the substrate 70 to the wiring pattern 62 of the substrate 60. In this case, the electronic component 65 and the substrate 70 are mounted on the substrate 60 so that the opening 70a of the substrate 70 faces the electronic component 65.

Figure 13B:
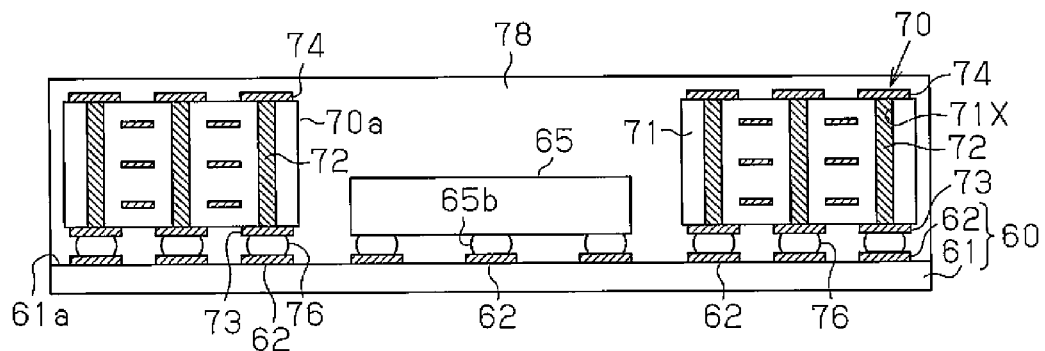

Then, referring to FIG. 13(b), the sealing resin 78 is formed on the surface 61a of the substrate body 61 to seal the electronic component 65 and the substrate 70. The sealing resin 78 can be formed by carrying out compression forming by performing heating and pressing using a mold for molding (upper mold and lower mold).

Figure 13C:
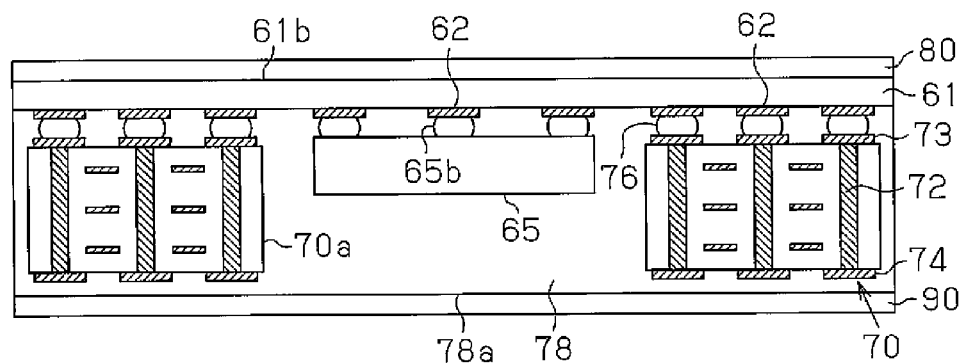

Then, after the roughening process is performed, the insulation layer 80 is formed to cover the surface 61b of the substrate body 61, and the insulation layer 90 is formed to cover the surfaces 78a of the sealing resin 78, as shown in FIG. 13(c). As one example of a method for forming the insulation layer 38, a resin film such as epoxy resin is laminated to cover the surface 61b of the substrate body 61, thermal processing is carried out at a temperature of about 190° C., and curing is performed. This forms the insulation layer 80. The insulation layer 80 may also be formed by applying liquid resin of epoxy resin or the like to cover the surface 61b of the substrate body 61, carrying out thermal heating at a temperature of about 190° C., and performing curing. Alternatively, the insulation layer 80 may be formed through the photolithography method, the screen printing method, or the like. The insulation layer 90 may be formed in the same manner as the insulation layer 80.

Figure 14A:
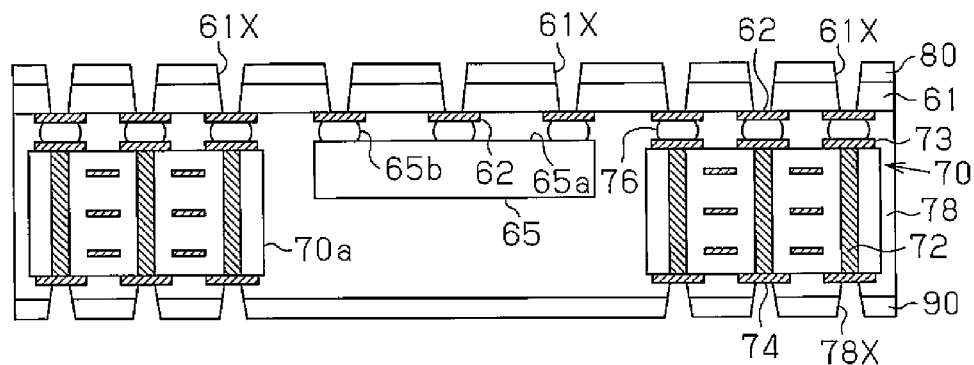
FIGS. 14(a) to 14(c) are schematic cross-sectional views showing the manufacturing method of the electronic component incorporation substrate of the fourth embodiment.

As shown in FIG. 14(a), the via hole 61X or a through hole that extends through the substrate body 61 and the insulation layer 80 is then formed to expose part of the wiring pattern 62. The via hole 78X is also formed in the sealing resin 78 and the insulation layer 90 to expose part of the wiring 74. The via holes 61X and 78 may be formed by laser processing. $CO_2$ laser, excimer laser, YAG laser, or the like can be used for the laser.

If the via holes 61X and 78X are formed through the laser processing method, desmear is performed on the interior of the via holes 61X and 78X to remove and clean the resin smears remaining in the via holes 61X and 78X. Potassium permanganate method, or the like can be used for the desmear.

Figure 14B:
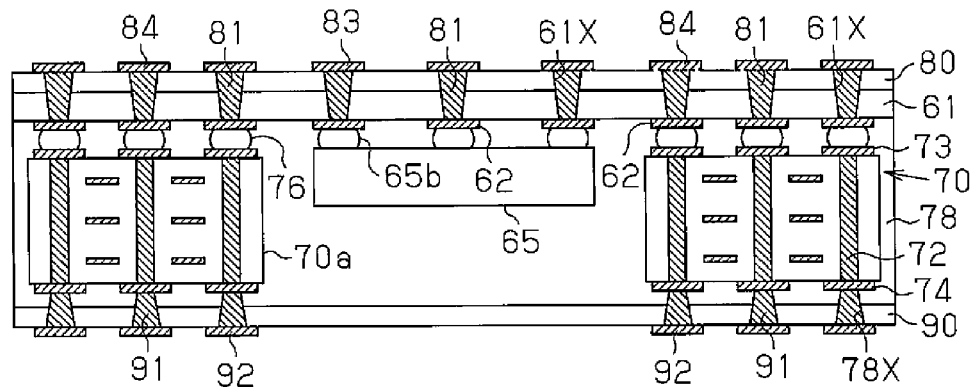

Then, as shown in FIG. 14(b), the wiring pattern 83, the upper wiring 84, and the via 81 are formed on the upper surface of the insulation layer 80 by the semi-additive method. In other words, a seed layer is formed to cover the insulation layer 80, the inner wall of the via hole 61X, and the wiring pattern 62, a resist having an opening pattern corresponding to the shape of the wiring pattern 83 and the upper wiring 84 is formed on the seed layer, and the via 81, the wiring pattern 83 and the upper wiring 84 are formed by an electrolyte copper plating having the seed layer as a power supplying layer. The wiring pattern 83 is thereby electrically connected to the electronic component 65 through the via 81, the wiring pattern 62, and the solder 65b.

The lower wiring 92 and the via 91 are formed on the lower surface of the insulation layer 90 by the semi-additive method. The lower wiring 92 is thereby electrically connected to the upper wiring 84 through the via 91, the wiring 74, the through via 72, the wiring 73, the solder 76, the wiring pattern 62, and the via 81.

Figure 14C:
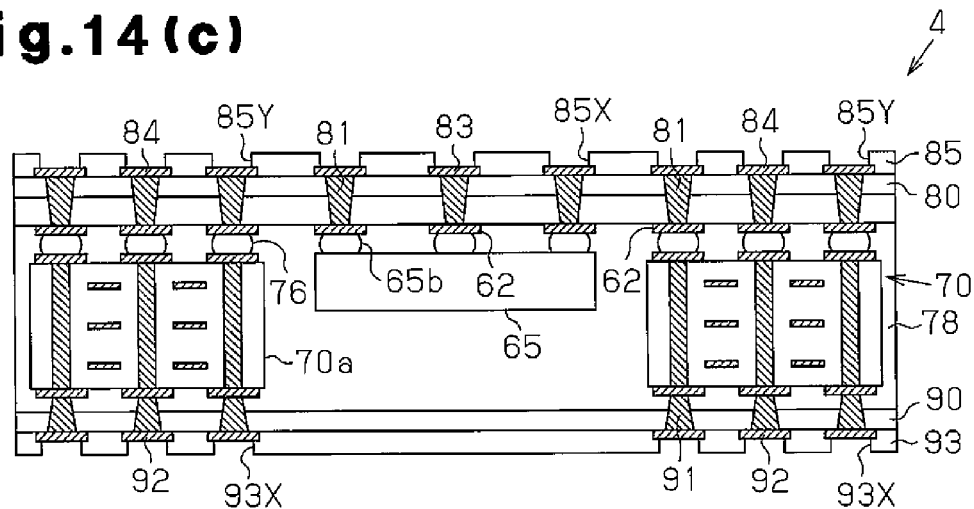

Then, referring to FIG. 14(c), the solder resist layer 85 having the openings 85X and 85Y, which respectively expose part of the wiring pattern 83 and the upper wiring 84, is formed to cover the wiring pattern 83, the upper wiring 84, and the insulation layer 80. For instance, after forming the solder resist layer 85 to cover the wiring pattern 83, the upper wiring 84, and the insulation layer 80, the solder resist layer 85 is exposed and developed by photolithography to form the openings 85X and 85Y shown in FIG. 14(c). The solder resist layer 93 having the opening 93X, which exposes part of the lower wiring 92, is formed to cover the lower wiring 92 and the insulation layer 90. For instance, after forming the solder resist layer 93 to cover the lower wiring 92 and the insulation layer 90, the solder resist layer 93 is exposed and developed by photolithography to form the opening 93X shown in FIG. 14(c). The electronic component incorporation substrate 4 of the present embodiment is manufactured through the above manufacturing steps.

The present embodiment described above has the following advantages.

(1) The electronic component 65 is mounted on the wiring pattern 62 of the substrate 60, and the wiring pattern 83 (additional wiring) is formed for the wiring pattern 62. The conductor exposed by the via hole 61X of the insulation layer 80 for additional wiring is not the connection terminal (solder 65b in the present example) of the electronic component 65, but is the wiring pattern 62 electrically connected to the solder 65b. The contamination by the solder 65b of the electronic component 65 thus does not occur at when performing wet processing to form the wiring pattern 83 (additional wiring). The contamination by the wiring pattern 62 is also suppressed from occurring by appropriately selecting the surface treatment of the substrate 60 (wiring pattern 62) to mount the electronic component 65. The electronic component 65 is thus incorporated regardless of the surface specification of the connection terminal of the electronic component 65, and the degree of freedom in selecting the material is increased.

(2) Further, the via hole 61X is formed in the insulation layer 80 for additional wiring and the substrate body 61 to expose the wiring pattern 62 electrically connected to the solder 65b of the electronic component 65. Thus, the circuit forming surface 65a and the like of the electronic component 65 are not influenced by laser even if the via hole 61X is formed by laser. A material having photosensitivity and a material that does not have photosensitivity may both be used as the material for the insulation layer 80. In other words, the degree of freedom in selecting the material of the insulation layer 80 is increased.

(3) The substrate 70, in which the wirings 73 and 74 formed on both surfaces (upper and lower surfaces) of the substrate body 71 are electrically connected through the through via 72 inside the substrate body 71, is incorporated. The upper wiring 84 and the lower wiring 92 formed on both surfaces of the electronic component incorporation substrate 4 are electrically connected to each other using the through via 72 of the substrate 70 and the wirings 73 and 74. The upper wiring 84 and the lower wiring 92 are thus electrically connected without forming a through hole that extends through the sealing resin 78 for sealing the electronic component 65.

When the height of the incorporating electronic component 65 increases, the height of the sealing resin 78 for sealing the electronic component 65 increases. In this case, it is difficult to form the through hole in the sealing resin 78 to electrically connect the upper and lower surfaces of the sealing resin 78 (to electrically connect the upper wiring 84 and the lower wiring 92). For instance, when forming the through hole in the sealing resin 78 through laser processing, it is difficult to form a straight hole with an inner wall having satisfactory quality.

In contrast, the electronic component incorporation substrate 4 of the present embodiment electrically connects the upper wiring 84 and the lower wiring 92 without forming the through hole that extends through the sealing resin 78, as described above. This ensures the electrical connection of the upper wiring 84 and the lower wiring 92 while preventing the occurrence of the above-described problems in advance even if the height of the incorporating electronic component 65 increases, that is, even if the height of the sealing resin 78 increases. The electronic component 65 is thus incorporated in the electronic component incorporation substrate 4 without being subjected to restrictions resulting from the height of the incorporating electronic component 65.

Other Embodiments

It should be apparent to those skilled in the art that the present invention may be embodied in many other specific forms without departing from the spirit or scope of the invention. Particularly, it should be understood that the present invention may be embodied in the following forms.

The structure of the substrate 50 (structure) in the third embodiment is not particularly limited. That is, the structure of the substrate 50 is not particularly limited as long as at least the wirings 53 and 54 formed on both surfaces of the substrate 50 are electrically connected through the interior of the substrate 50 (substrate body 51). The first surface and the second surface of the substrate 50 may be electrically connected through a plurality of vias. The substrate 50 may be formed by a double-sided print wiring board.

The structure of the substrate 70 (structure) in the fourth embodiment is not particularly limited. In other words, the structure of the substrate 70 is not particularly limited as long as at least the wirings 73 and 74 formed on both surfaces of the substrate are electrically connected through the interior of the substrate 70 (substrate body 71). The first surface side and the second surface side of the substrate 70 may be electrically connected through a plurality of vias. The substrate 70 may be formed by a double-sided print wiring board.

Figure 15A:
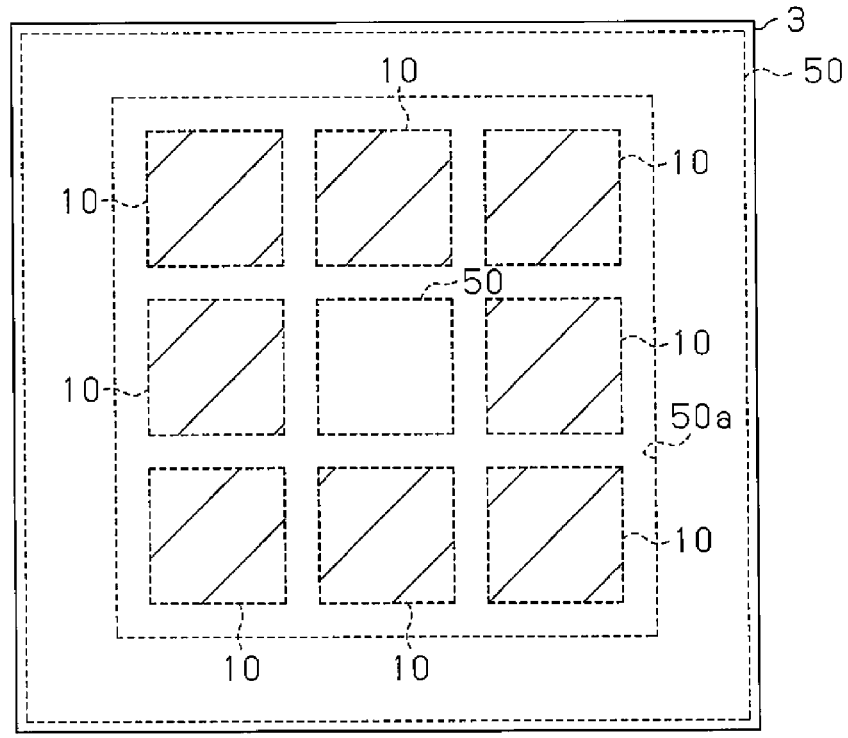
FIGS. 15(a) and 15(b) are schematic plan views showing an electronic component incorporation substrate of a modified example.
Figure 15B:
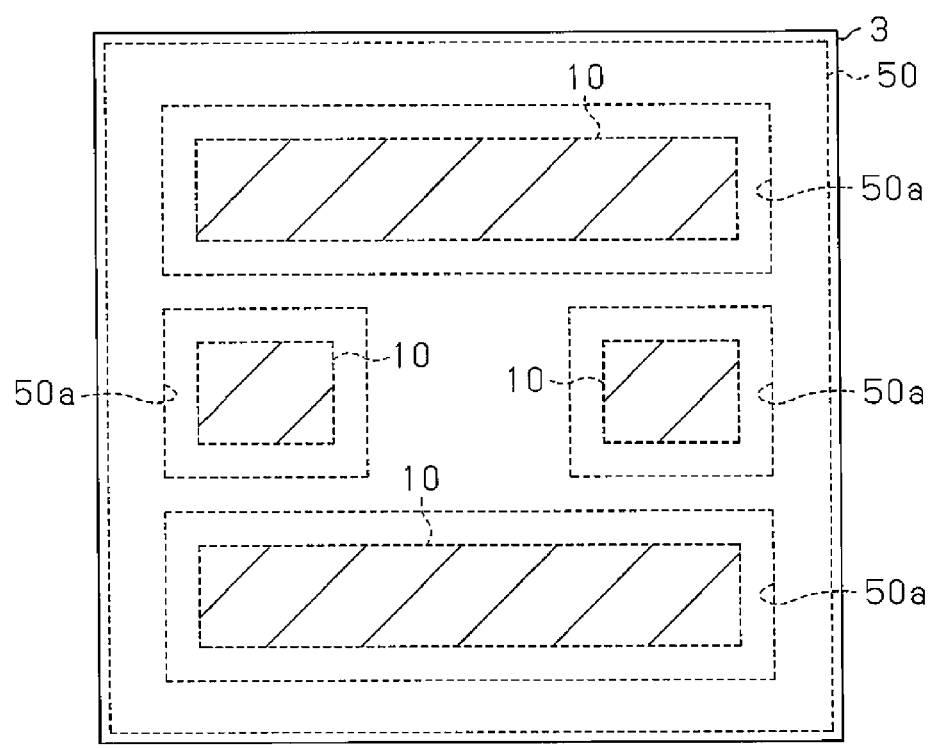

The first structure 10 and the substrate 50 in the third embodiment are not particularly limited to the configuration shown in FIG. 8. As shown in FIGS. 15(a) and 15(b), a plurality of first structures 10 (electronic component 16) may be incorporated in the electronic component incorporation substrate 3. The plurality of electronic components 16 may be different electronic components or the same. In this case, a plurality of openings 50a are formed at positions corresponding to the layout positions of the plurality of first structures 10 with respect to the substrate 50, as shown in FIG. 15(b). The opening 50a is larger than the outer shape of the corresponding first structure 10.

Further, as shown in FIG. 15(a), a plurality of substrates 50 may be incorporated in the electronic component incorporation substrate 3. In this case, the same advantages as the third embodiment are achieved by arranging the first structure 10 and the substrate body 51 portion of the substrate 50 at different positions. In the example of FIG. 15(a), the opening 50a of the substrate 50 arranged outward from the plurality of first structures 10 is larger than the outer shape of the plurality of first structures 10.

In the same manner as the relationship between the first structure 10 and the substrate 50 described above, the electronic component 65 and the substrate 70 in the fourth embodiment are not particularly limited to the configuration shown in FIG. 12. A plurality of electronic components 65 may be incorporated in the electronic component incorporation substrate 4. The plurality of electronic components 65 may be different electronic components or the same. A plurality of substrates 70 may be incorporated in the electronic component incorporation substrate 4.

In the first to third embodiments described above, the first structure 10 may be sealed with the sealing resin 20 to 22. Then, the sealing resins 20 to 22 and the sealing resin 17 in the first structure 10 may be simultaneously undergo final curing. The manufacturing method of the electronic component incorporation substrate 1 to 3 in this case will now be described. Here, an example in which the manufacturing method of the third embodiment is deformed will be described.

Figure 16A:
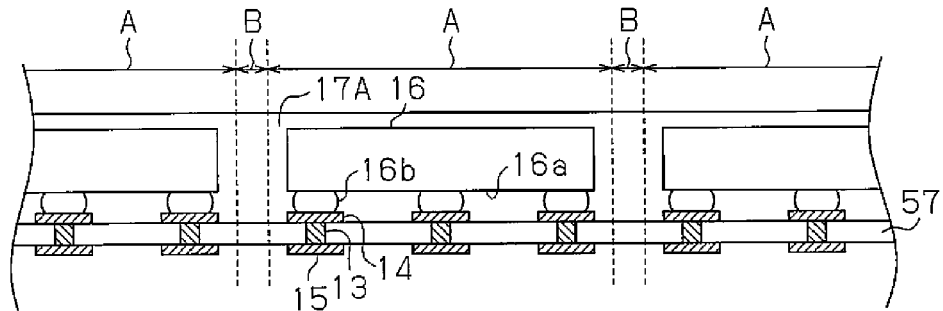
FIGS. 16(a) to 16(d) are schematic cross-sectional views showing the manufacturing method of the electronic component incorporation substrate of the modified example.

First, referring to FIG. 2(a), the through hole 12X, the through via 13, and the wiring patterns 14 and 15 are formed in the substrate 57. Then, the electronic component 16 is mounted on the substrate 57, as shown in FIG. 16(a). Further, the sealing resin 17A is formed on the substrate 57 to seal the electronic component 16, the solder 16b, and the wiring pattern 14. The sealing resin 17A in this case is in a half-cured state and does not undergo the final curing (complete curing).

Figure 16B:
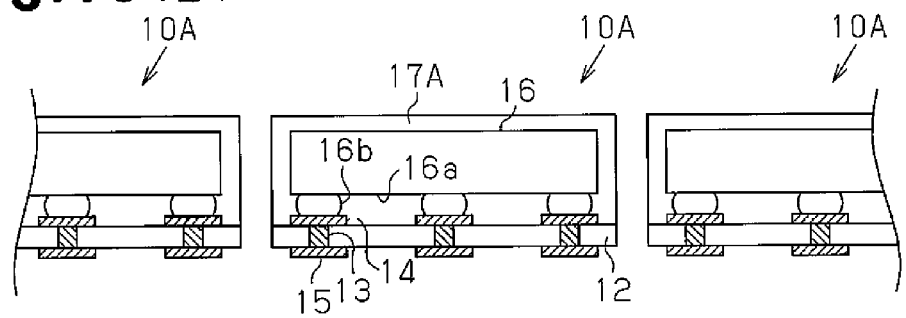

Then, as shown in FIG. 16(b), the sealing resin 17A and the substrate 57 of the portion corresponding to the cutting region B are cut by a dicing blade or the like. This manufactures a plurality of first structures 10A sealed by the sealing resin 17A in a half-cured state.

Figure 16C:
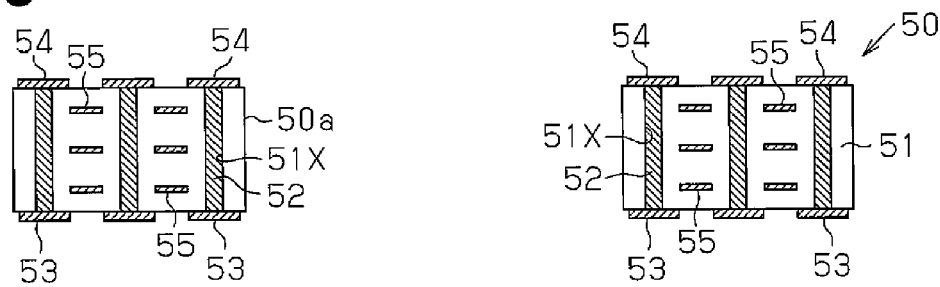

As shown in FIG. 16(c), the substrate 50 is prepared as described in FIGS. 9(a) and 9(b).

Figure 16D:
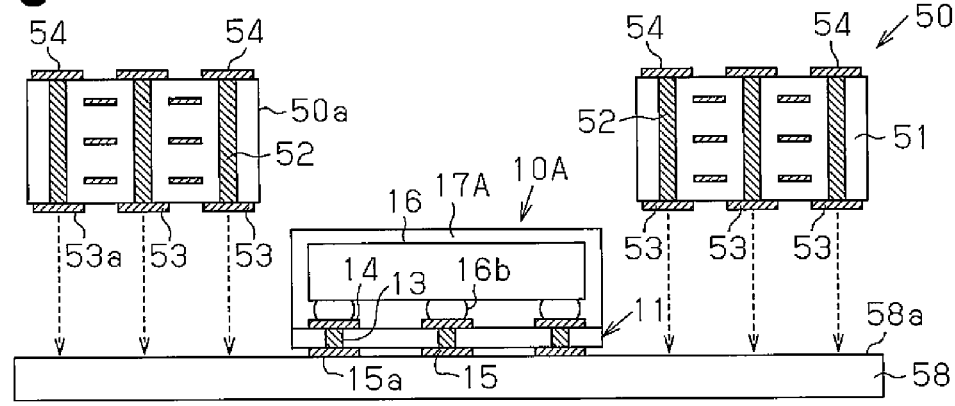

Then, in the step shown in FIG. 16(d), the support body 58 is prepared. The first structure 10A is fixed on the surface 58a (adhesive surface) of the support body 58 so that the surface 58a of the support body 58 and the surface 15a of the wiring pattern 15 of the first structure 10A face each other. The substrate 50 is further fixed on the surface 58a of the support body 58 so that the support surface 58a of the support body 58 and the surface 53a of the wiring 53 of the substrate 50 face each other and so that the opening 50a faces the first structure 10A.

Figure 17A:
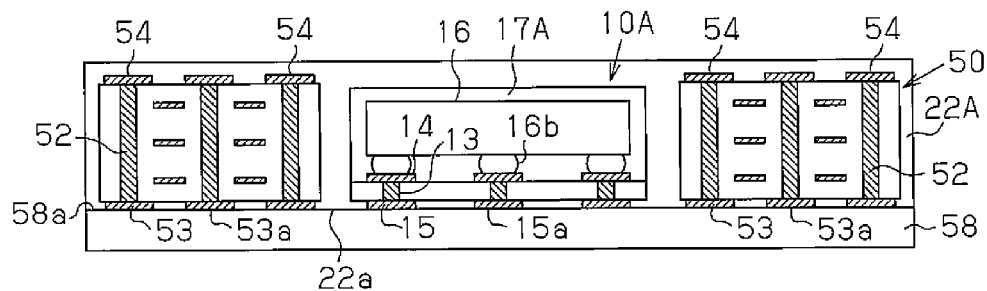
FIGS. 17(a) and 17(b) are schematic cross-sectional views showing the manufacturing method of the electronic component incorporation substrate of the modified example.

Then, as shown in FIG. 17(a), the sealing resin 22A is formed on the surface 58a of the support body 58 to seal the first structure 10A and the substrate 50 fixed on the support body 58. The sealing resin 22A in this case is in a half-cured state and does not undergo final curing.

Figure 17B:
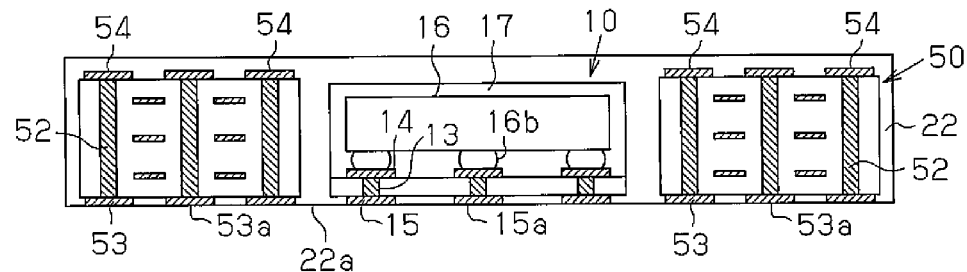

Then, as shown in FIG. 17(b), the support body 58 is removed, and the sealing resins 17A and 22A simultaneously undergo thermal processing and final curing (complete curing). This forms the sealing resins 17 and 22 and the first structure 10, which is sealed by the sealing resin 17. The first structure 10 and the substrate 50 are sealed by the sealing resin 22. The thermal processing is carried out for two hours under a temperature of 170° C.

The subsequent manufacturing steps are performed in the same manner as the steps shown in FIGS. 10(a) to 10(d) and thus will not be described.

In such a manufacturing method, the sealing resin 17A that seals one side of the substrate 57, on which the electronic component 16 is mounted, is not completely cured before dicing. This prevents warping of the first structure 10A in the sealed state. Thus, the workability and the processing accuracy of the dicing are improved. This allows reduction in the size of the first structure 10 and lowers cost.

A modified example of the manufacturing method of the third embodiment has been described. However, the manufacturing methods of the first and second embodiments may be modified in the same manner.

Figure 18:
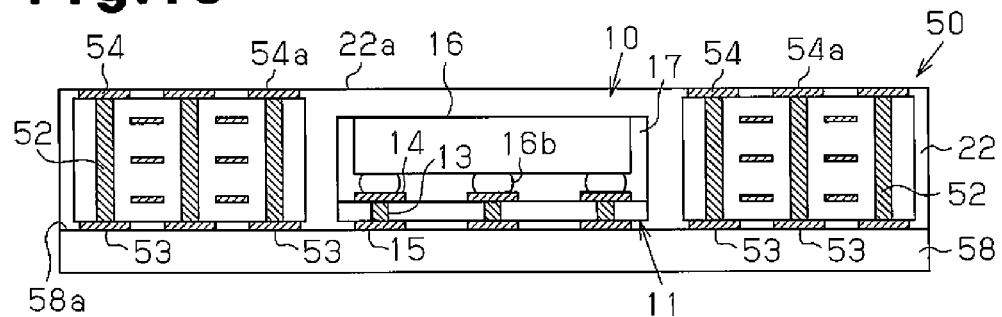
FIG. 18 is a schematic cross-sectional view showing an electronic component incorporation substrate of a modified example.

The sealing resin 22 sealed in the step shown in FIG. 9(d) of the third embodiment may be modified as shown in FIG. 18. In other words, the sealing resin 22 may be formed on the surface 58a of the support body 58 so that the surface 22a of the sealing resin 22 is flush with the surface 54a of the wiring 54 of the substrate 50.

The sealing resin 22 formed in the step shown in FIG. 9(d) of the third embodiment may be removed through polishing, etching, blasting, or the like to expose the surface 54a of the wiring 54, as shown in FIG. 18.

The sealing resin 17 in the first to third embodiments may be modified as shown in FIG. 18. In other words, the sealing resin 17 may be formed on the substrate 11 so that the resin sealing surface (upper surface in FIG. 18) of the sealing resin 17 is flush with the surface (upper surface in FIG. 18) opposite to the circuit forming surface of the electronic component 16. Alternatively, the sealing resin 17 may be omitted.

Figure 19:
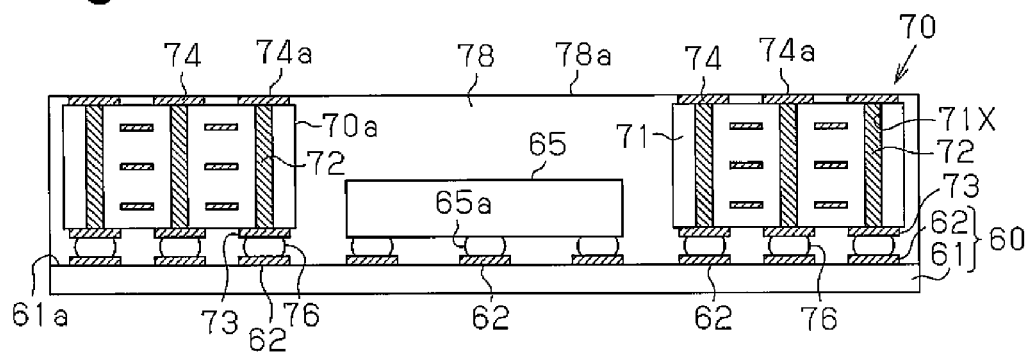
FIG. 19 is a schematic cross-sectional view showing an electronic component incorporation substrate of a modified example.

The sealing resin 78 formed in the step shown in FIG. 13(b) of the fourth embodiment may be modified as shown in FIG. 19. In other words, the sealing resin 78 may be formed on the surface 61a of the substrate body 61 so that the surface 78a of the sealing resin 78 is flush with the surface 74a of the wiring 74 of the substrate 70.

The sealing resin 78 formed in the step shown in FIG. 13(b) of the fourth embodiment may be removed through polishing, etching, blasting, or the like to expose the surface 74a of the wiring 74, as shown in FIG. 19.

Figure 20:
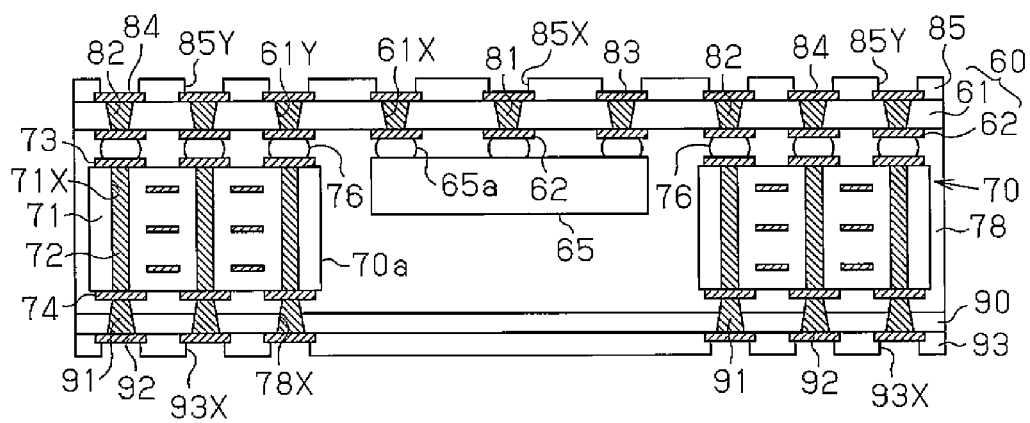
FIG. 20 is a schematic cross-sectional view showing an electronic component incorporation substrate of a modified example.

As shown in FIG. 20, the insulation layer 80 for additional wiring formed on the substrate 60 may be omitted. Specifically, the insulation layer 80 may be omitted if the substrate body 61 of the substrate 60 is formed by a material applicable to the wet process, which forms the wiring pattern 83, the upper wiring 84, and the like.

Figure 21:
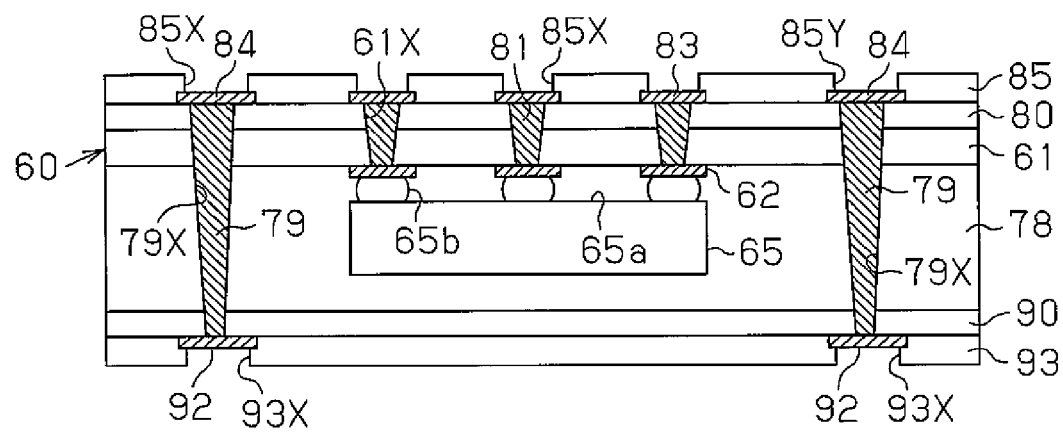
FIG. 21 is a schematic cross-sectional view showing an electronic component incorporation substrate of a modified example.

The electronic component incorporation substrate 4 according to the fourth embodiment may be modified as shown in FIG. 21. In other words, The upper wiring 84 and the lower wiring 92 may be electrically connected through the through via 79 that extends through the sealing resin 78 in place of the substrate 70 of the electronic component incorporation substrate 4. The through via 79 is formed in the through hole 79X that extends through the sealing resin 78, the substrate body 61, and the insulation layers 80, 90. The first end of the through via 79 is connected to the upper wiring 84 and the second end is connected to the lower wiring 92. In other words, in the electronic component incorporation substrate shown in FIG. 21, the first surface (upper surface) and the second surface (lower surface) of the sealing resin 78 are electrically connected through the through via 79. The through hole 79X and the through via 79 may be formed through a method in the same manner as the method (steps shown in FIGS. 6(a) and 6(b)) for forming the through hole 21X and the through via 40 of the second embodiment.

Figure 22:
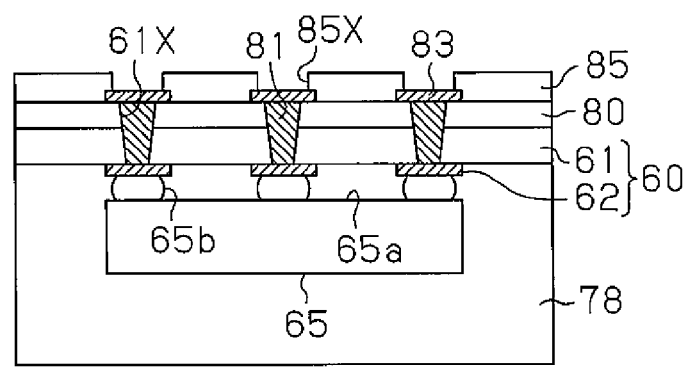
FIG. 22 is a schematic cross-sectional view showing an electronic component incorporation substrate of a modified example.

The electronic component incorporation substrate 4 of the fourth embodiment may be modified as shown in FIG. 22. In other words, the substrate 70 of the electronic component incorporation substrate 4 may be omitted. More specifically, the wiring pattern 62, the vias 81 and 91, the upper wiring 84, and the lower wiring 92 electrically connected to the substrate 70 and the wirings 73 and 74 of the substrate 70 may be omitted.

The present examples and embodiments are to be considered as illustrative and not restrictive, and the invention is not to be limited to the details given herein, but may be modified within the scope and equivalence of the appended claims.

The invention claimed is:

1. A semiconductor device comprising:
   a first structure including a first substrate and an electronic component, wherein the first substrate includes a first surface and an opposite second surface, and the electronic component is arranged on the first surface of the first substrate and electrically connected to first wiring pattern formed on the first surface of the first substrate by solder;
   a first sealing resin layer that seals the first structure and is formed on the first surface of the first substrate;
   a second sealing resin layer that further seals and completely covers the first structure, wherein the second sealing resin layer includes a first surface and a second surface opposite the first surface;
   an insulation layer formed on the second surface of the first substrate and the first surface of the second sealing resin layer, wherein the insulation layer is larger than the first substrate when viewed from above;
   a via that extends through the insulation layer and is directly connected to a second wiring pattern formed on the second surface of the first substrate;
   additional wiring formed on the insulation layer and electrically connected to the electronic component through the first substrate and the via;
   another insulation layer formed on the second surface of the second sealing resin layer; and
   further wiring formed on another insulation later.

2. The semiconductor device according to claim 1, further comprising a second substrate that is sealed by the second sealing resin layer, wherein the second substrate includes a first surface and an opposite second surface, and the first and second surfaces of the second substrate are electrically connected, wherein the first and second surfaces of the second sealing resin layer are electrically connected through the second substrate.

3. The semiconductor device according to claim 1, wherein and the second sealing resin layer further includes a through electrode that extends through the second sealing resin layer and electrically connects the first and second surfaces of the second sealing resin layer.

* * * * *